United States Patent
Langer

(10) Patent No.: US 9,461,590 B2
(45) Date of Patent: Oct. 4, 2016

(54) ENVELOPE TRACKING IN CONNECTION WITH SIMULTANEOUS TRANSMISSION IN ONE OR MORE FREQUENCY BANDS

(71) Applicant: Intel Corporation, Santa Clara, CA (US)

(72) Inventor: Andreas Langer, Lohhof (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/568,313

(22) Filed: Dec. 12, 2014

(65) Prior Publication Data

US 2016/0173031 A1    Jun. 16, 2016

(51) Int. Cl.
*H03F 3/68* (2006.01)
*H03F 1/02* (2006.01)
*H03F 3/19* (2006.01)
*H03F 3/21* (2006.01)

(52) U.S. Cl.
CPC ............ *H03F 1/0205* (2013.01); *H03F 3/19* (2013.01); *H03F 3/211* (2013.01); *H03F 2200/451* (2013.01); *H03F 2203/21106* (2013.01)

(58) Field of Classification Search
CPC ....................................................... H03F 3/68
USPC .............................. 330/126, 297, 295, 124 R
See application file for complete search history.

(56) References Cited

U.S. PATENT DOCUMENTS

| | | | | |
|---|---|---|---|---|
| 8,942,651 | B2 * | 1/2015 | Jones ............................. | 455/118 |
| 9,041,365 | B2 * | 5/2015 | Kay ............................... | 323/268 |
| 2008/0278136 | A1 | 11/2008 | Murtojarvi | |
| 2012/0139641 | A1 * | 6/2012 | Kaczman ............... | H03F 1/0222 330/295 |
| 2013/0135043 | A1 | 5/2013 | Hietala et al. | |
| 2014/0118065 | A1 | 5/2014 | Briffa et al. | |
| 2014/0266462 | A1 * | 9/2014 | Schirmann ............... | H03F 3/602 330/295 |
| 2014/0361837 | A1 * | 12/2014 | Strange ................. | H03F 1/0222 330/297 |
| 2015/0011256 | A1 * | 1/2015 | Tanaka ................. | H04B 1/0475 455/552.1 |
| 2015/0048891 | A1 * | 2/2015 | Rozek ..................... | H02M 3/07 330/297 |
| 2015/0188432 | A1 * | 7/2015 | Vannorsdel ........... | H02M 3/156 323/271 |
| 2015/0270806 | A1 * | 9/2015 | Wagh . ................... | H03F 3/211 330/296 |

OTHER PUBLICATIONS

European Search Report, Application No. 15193968.3-1805, Dated Apr. 29, 2016.

* cited by examiner

*Primary Examiner* — Patricia T Nguyen
(74) *Attorney, Agent, or Firm* — Eschweiler & Associates, LLC

(57) ABSTRACT

Envelope tracking (ET) is enabled in connection with single-band or multi-band transmission. One example system includes two or more power amplification components associated with distinct frequency bands, with at least one including a first power amplifier (PA) configured to operate in an ET mode, and at least one including a second PA configured to operate in an average power tracking (APT) mode of operation. A first DC-to-DC converter is configured to provide a first supply voltage according to the ET mode to each first PA, and a second DC-to-DC converter is configured to provide a second supply voltage according to the APT mode to each second PA. A control component is configured to determine a present transmission mode and to select on that basis one or more PAs, wherein the control component selects at most one of the first PAs and at most one of the second PAs.

25 Claims, 10 Drawing Sheets

ENVELOPE TRACKING IN CONNECTION WITH SIMULTANEOUS TRANSMISSION IN ONE OR MORE FREQUENCY BANDS

FIELD

The present disclosure relates to envelope tracking, and more specifically, to enabling envelope tracking in connection with single-band or multi-band transmission, such as uplink carrier aggregation or dual SIM (subscriber identity module) dual active transmission.

BACKGROUND

An efficient way to optimize the power amplifier (PA) current consumption in a wireless system across the entire output power range is the use of a DC-DC converter to provide a variable PA supply voltage to a PA. Depending on the RF output power, for example, the output voltage of the DC-DC converter to the PA is adjusted. As the output power lowers, the PA supply voltage to the PA also lowers as a result. Due to a voltage conversion from the battery voltage down to the lower PA supply voltage, the battery current is reduced. Alternatively, the DC-DC converter output voltage can be fixed based on the target RF power (average RF power), which is expected in a next period of time. This procedure is sometimes called average power tracking (APT), in which a constant voltage is supplied to the PA.

Envelope tracking DC-DC (ET DC-DC) converters or envelope tracking modulators are capable of envelope tracking to further reduce the battery current in various situations. Envelope tracking describes an approach to RF amplifier operation, for example, in which the power supply voltage applied to the power amplifier is constantly adjusted to ensure that the amplifier is operating at or close to peak efficiency for the given instantaneous output power requirements.

A feature of envelope tracking is that the supply voltage of the power amplifier is not constant. The supply voltage of the power amplifier depends on the instantaneous envelope of the modulated baseband signal or radio frequency (RF) input signal, which is input into the PA. For example, an ET DC-DC converter follows the instantaneous envelope of the RF signal, which removes the voltage headroom and further increases the system efficiency (composite efficiency of the power amplifier and the DC-DC converter). An ET DC-DC converter, for example, can reduce the battery current of a Long Term Evolution (LTE) signal by roughly 20+% at maximum output power relative to a standard DC-DC converter, which simply follows an average power or a constant power supply.

DETAILED DESCRIPTION

Figure 1:
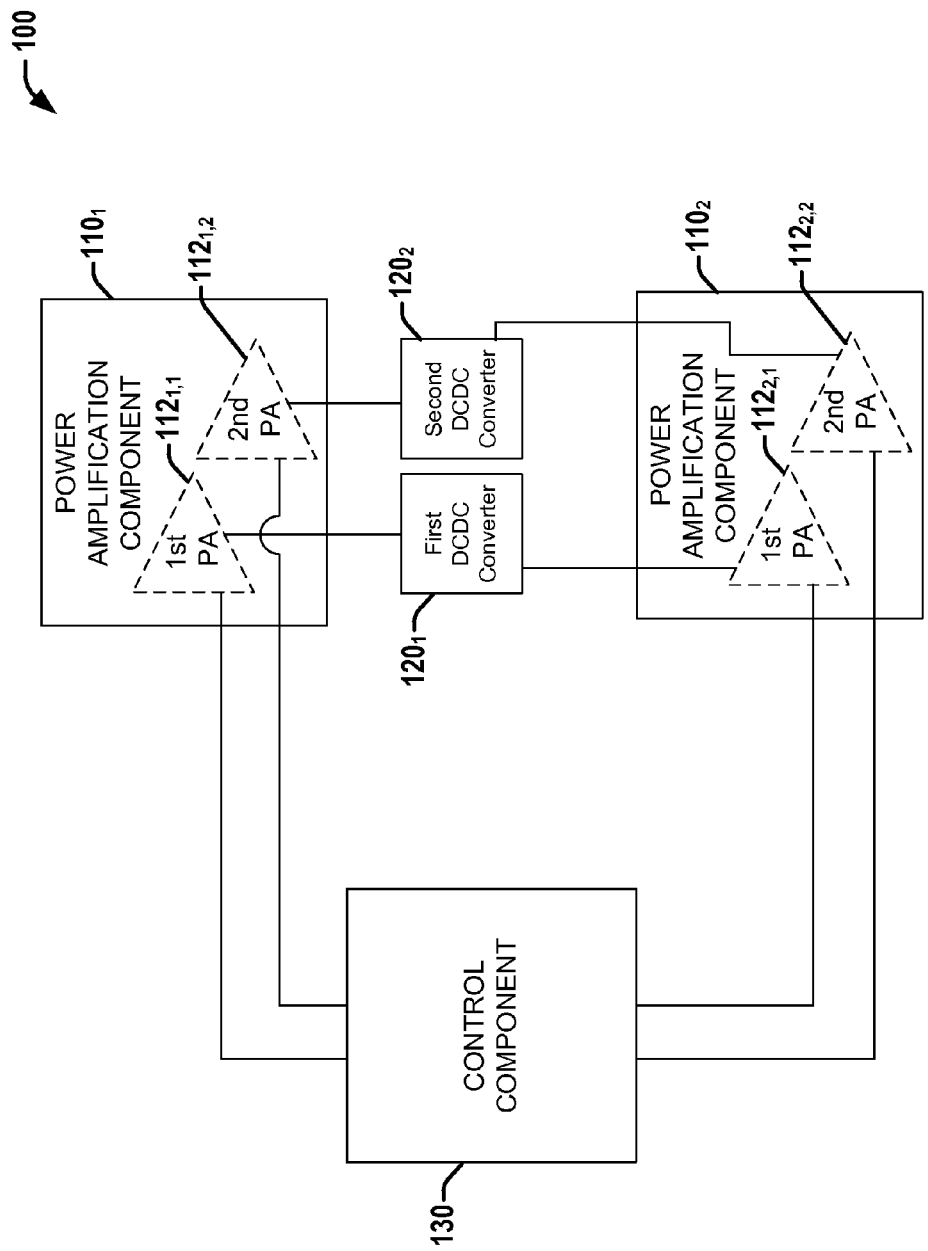
FIG. 1 is a block diagram illustrating a system or device that facilitates envelope tracking (ET) in connection with simultaneous transmission in up to two frequency bands according to various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Under optimal operating conditions, envelope tracking (ET) can provide substantial efficiency gains over average power tracking (APT) methods of controlling the supply voltage to a power amplifier (PA). However, in many transmit scenarios, operating conditions are less than optimal for ET, and a major bottleneck for achieving superior current consumption performance is the efficiency of the PA when operating in ET mode. The ET relevant efficiency of a state-of-the-art PA is between 45 and 55% for multimode multiband PA (MMMB PA). A PA design which is fully optimized for ET operation will exceed an efficiency of 60%. However, a highly ET-optimized PA might show a strong amplitude-to-amplitude distortion (AMAM) and amplitude-to-phase distortion (AMPM) conversion. Thus, to maintain linearity, a highly ET-optimized PA might require digital pre-distortion (DPD) when operating in ET mode, and potentially even when operating in APT mode. Due to ET mode providing greater efficiency gains at higher output powers, there is a breakeven output power where the efficiency in ET mode drops below the efficiency in APT mode. Therefore, at low to mid power, APT mode is more efficient than ET mode, and can be employed up to the output power where ET is enabled.

Carrier aggregation (CA) is a way of increasing the bandwidth of an uplink or downlink signal by aggregating multiple component carriers to the uplink or downlink signal. Long Term Evolution (LTE)-Advanced is an evolutionary path from LTE Release 8 and introduced by Release 10 of the Third Generation Partnership Project (3GPP) standardization. LTE-A provides for carrier aggregation of up to five component carriers with bandwidths of 1.4, 3, 5, 10, 15, or 20 MHz, for a maximum aggregated bandwidth of 100 MHz. Initial LTE-A deployments will likely be limited to two up-link component carriers, with a maximum bandwidth of 40 MHz, although future deployments may employ three, four, or five component carriers, and future standards could potentially provide for CA with more component carriers, more bandwidth per component carrier, or both.

There are different types or modes of CA. Each component carrier can be within the same operating frequency band (referred to as intra-band CA), or component carriers can be from more than one operating frequency band (referred to as inter-band CA). Additionally, contiguous or non-contiguous component carriers can be used for CA, and contiguous or non-contiguous resource block allocation can be employed within the component carrier channel bandwidth. Non-contiguous resource block allocation within the channel bandwidth of a component carrier is referred to as multi-cluster transmission. Additionally, CA-capable devices can also employ a single carrier CA mode wherein CA is not employed.

The total output power (the sum of each of the component carriers) does not increase due to CA. However, due to CA or multi-cluster transmission, the single carrier property of the single carrier frequency division multiple access (SC-FDMA) LTE uplink modulation scheme is no longer preserved, which results in a higher peak-to-average ratio of the signal. Release 10 of the Third Generation Partnership Project (3GPP) standardization specifies various maximum power reduction figures to mitigate the effects caused by the higher peak-to-average power.

Implementing CA has a significant impact on the RF front end architecture. The simultaneous operation of two (or more) power amplifiers (PAs) is used to support inter-band uplink CA. In one potential implementation of ET in connection with uplink CA, two simultaneously operating PAs would employ two ET DC-to-DC converters. Moreover, these are the major inter-band uplink CA scenarios for two component carriers: (1) one transmit (TX) in a low band frequency range (e.g., 699-915 MHz) and one TX in a mid-band frequency range (e.g., 1710-1980 MHz), (2) one TX in the low band frequency range and one TX in a high-band frequency range (e.g., 2300-2690 MHz), and (3) one TX in the mid-band frequency range and one TX in the high-band frequency range. To cover these scenarios, the potential implementation would employ three independent PA chains and thus at least three ET DC-to-DC converters. However, the printed circuit board (PCB) area of a state-of-the-art tracker (including external passive components) is around 25 $mm^2$, with a significant cost as well.

However, this potential implementation does not yet address the challenges of high transmission bandwidth for intra-band CA. In 2015, the support of 40 MHz in LTE time division duplexing (TDD) bands (e.g., B41, etc.) will be expected, with up to 100 MHz aggregated bandwidth expected in the future. Most trackers do not support 40 MHz bandwidth, and none currently support more than 40-60 MHz transmission bandwidth with reasonable performance and implementation cost. Additionally, since the PA operates in compression during ET mode, the AMAM and AMPM response of the PA is highly sensitive to load mismatch at the PA output. If the PA is loaded by a duplexer (or other filter), the AMAM and AMPM characteristics of the PA can significantly change within the transmission bandwidth due to resonances in the duplex filter, which will introduce memory effects in the transmission chain, and further complicate ET and potential pre-distortion techniques, or even render them virtually impossible for wideband transmission signals.

Thus, two areas to address in implementing ET in connection with uplink CA are (1) adapting an ET system for inter-band CA so that two or more simultaneously transmitting PAs are supported and (2) adapting an ET system for intra-band CA so that greater transmission bandwidth (e.g., more than 40 MHz, etc.) can be supported. Embodiments and aspects described herein can enable ET in conjunction with any of a variety of uplink CA modes (e.g., inter-band CA, intra-band CA, multi-cluster transmission, single carrier (i.e., no CA), etc.).

In various aspects, embodiments described herein can facilitate ET in connection with transmission modes involving either transmission in a single frequency band or simultaneous transmission in multiple frequency bands. Transmission modes involving transmission in a single frequency band can include, for example, a single carrier transmission mode or intra-band carrier aggregation, described in greater detail above. Transmission modes involving transmission in multiple simultaneous frequency bands can include, for example, a multiple SIM (subscriber identity module) transmission mode such as dual SIM dual active (DSDA), or inter-band carrier aggregation, described above. DSDA is a multi-SIM feature wherein two RATs (radio access technologies, e.g., 3G, LTE, etc.) are operating independently at the same time. For example, a 3G call associated with a first SIM card and an LTE data transfer associated with a second SIM card operate simultaneously on different transmit chains. In general, RATs are not synchronized with one another, and will independently transmit in different frequency bands. Embodiments described herein can also facilitate ET in transmission modes that are combinations of those described above. Examples could include multi-SIM modes involving more than two RATs transmitting at the same time, a multi-SIM transmission mode wherein at least one of the RATs involves intra-band or inter-band CA, etc. However, even with a single SIM, transmissions on multiple RATs, or more generally, on multiple wireless technologies can be aggregated to provide higher aggregated throughput or to allow services to be implemented on the most suitable RAT or wireless technology. Examples include aggregation of data transmitted via High Speed Packet Access (HSPA, a 3G technology) and LTE (4G), or running transmission over WLAN (e.g., IEEE 802.11 and variants) and cellular. Further, more diverse additional transmissions can be active concurrently, as well, including connectivity technologies (e.g. Bluetooth or near field communications (NFC)).

Referring to FIG. 1, illustrated is a block diagram of a system 100 that facilitates envelope tracking (ET) in connection with simultaneous transmission in up to two frequency bands according to various aspects described herein. System 100 can facilitate ET in connection with CA scenarios involving intra-band CA or inter-band CA involving component carriers in two distinct frequency bands (e.g., low and mid, low and high, mid and high, etc.), in multi-SIM scenarios such as DSDA, etc. System 100 includes a first power amplification component $110_1$, a second power amplification component $110_2$, a first DC-to-DC converter $120_1$, a second DC-to-DC converter $120_2$, and a control component 130. First power amplification component $110_1$ includes at least one PA configured to transmit on a first frequency band associated with the first power amplification component $110_1$, which can be a first PA $112_{1,1}$ or a second PA $112_{1,2}$ (the first subscript index indicates the power amplification component that comprises the PA (or equivalently, the frequency band of the PA), and the second subscript indicates which DC-to-DC converter the PA is coupled to). Similarly, second power amplification component $110_2$ includes at least one PA configured to transmit on a second frequency band associated with the second power amplification component $110_2$, which can be a first PA $112_{2,1}$ or a second PA $112_{2,2}$. At least one first PA $112_{1,1}$ or $112_{2,1}$ and at least one second PA $112_{1,2}$ or $112_{2,2}$ can be included in system 100. Although, for clarity of illustration and explanation, the PAs $112_{1j}$ ($112_{1,1}$, $112_{1,2}$, or both) of the first power amplification component $110_1$, are shown adjacent to one another (and likewise with the PAs $112_{2,j}$ ($112_{2,1}$, $112_{2,2}$, or both) of the second power amplification component $110_2$) and can be co-located or included on the same module (e.g., a dual- or multi-core PA or PAD (PA with integrated duplexer), etc.), they need not be. In various aspects, power amplification components $110_i$ (e.g., $110_1$, $110_2$, etc.) described herein can be, for example, collections of PAs $112_{i,j}$ (e.g., $112_{1,1}$, $112_{1,2}$, or both as a first collection; $112_{2,1}$, $112_{2,2}$, or both as a second collection; etc.) operating on a common frequency band, or can include additional structure or associations between the PAs $112_{i,j}$ operating on the common frequency band (e.g., by being co-located, by being in an integrated dual- or multi-core module with one another, etc.). Any PA cores of a given power amplification component can be designed to achieve the same or a similar maximum output power (e.g., 28 dBm, etc.) in the given frequency range.

The first DC-to-DC converter $120_1$ is configured to provide a first supply voltage according to an ET mode of operation, and is coupled to each of the first PAs $112_{i,1}$ ($112_{1,1}$, $112_{2,1}$, or both), which are also configured to operate according to the ET mode of operation (e.g., by being at least partially optimized to operate according to the ET mode in their respective frequency bands (first or second), for example, to provide the highest peak efficiency when operating in ET mode, etc.). For each frequency band in which ET operation is to be available in system 100 (e.g., first frequency band, second frequency band), the corresponding first PA (first PA $112_{1,1}$ and/or first PA $112_{2,1}$) can be included in the respective power amplification component ($110_1$ or $110_2$) to enable ET mode in that frequency band (additional and/or alternative ways to enable ET mode are discussed below). Thus, ET mode can be enabled in multiple frequency bands through the inclusion of a single ET DC-to-DC converter $120_1$, providing a savings in both cost and PCB area, as ET trackers have a significant impact on both cost and PCB area.

The second DC-to-DC converter $120_2$ is configured to provide a second supply voltage according to an APT mode of operation, and is coupled to each of the second PAs $112_{i,2}$ ($112_{1,2}$, $112_{2,2}$, or both), which are also configured to operate according to the APT mode of operation (e.g., by being at least partially optimized to operate according to the APT mode in their respective frequency bands (first or second), for example, for high linearity in APT mode in conjunction with support of a high transmission bandwidth (e.g., up to 100 MHz or more), etc.). For each frequency band in which APT operation is to be available in system 100 (e.g., first frequency band, second frequency band), the corresponding second PA (second PA $112_{1,2}$ and/or second PA $112_{2,2}$) can be included in the respective power amplification component ($110_1$ or $110_2$) to enable APT mode in that frequency band (additional and/or alternative ways to enable APT mode are discussed below). Thus, APT mode can be enabled in multiple frequency bands through the inclusion of a single APT DC-to-DC converter $120_2$, providing additional savings in both cost and PCB area. In various aspects, the first and second DC-to-DC converters $120_1$ and $120_2$ can be separate, or can be part of the same module, such as in a dual- or multi-core DC-to-DC converter.

Control component 130 is configured to receive information associated with at least one input RF signal (e.g., with more than one in DSDA) to be amplified by system 100 for subsequent transmission, and to determine a present transmission mode (e.g., DSDA, inter-band CA, intra-band CA, multi-cluster transmission, single carrier (i.e., no CA), etc., wherein the present transmission mode can indicate which component carriers are to be used for transmitting), which can be determined by analyzing the received information (which can include the input RF signal(s), other information associated with them, or both). The control component 130 is also configured to select one or more of the PAs ($112_{1,1}$, $112_{1,2}$, $112_{2,1}$, and $112_{2,2}$), based at least in part on the determined present transmission mode. To maintain isolation between the PAs, control component 130 is configured to select at most one of the first PAs ($112_{1,1}$ and $112_{2,1}$) and at most one of the second PAs ($112_{1,2}$, and $112_{2,2}$) at the same time, so that each of the DC-to-DC converters $120_1$ and $120_2$ is providing its associated supply voltage to either zero or one simultaneously active PAs. Each of the selected PAs is configured to receive a (first or second) subset of the input RF signal(s) (a portion of the signal in inter-band CA, one of two signals in DSDA, or all of the signal in single carrier or entirely intra-band CA modes) that is associated with its frequency band (first or second), and configured to amplify the received subset of the input signal for subsequent transmission.

For given input RF signal(s) to system 100, the signal is within the first frequency band (associated with the first power amplification component $110_1$ and its PAs $112_{1,1}$ and $112_{1,2}$), within the second frequency band (associated with the second power amplification component $110_2$ and its PAs $112_{2,1}$ and $112_{2,2}$), or portions of the signal(s) are in each of the first and second frequency bands (i.e., in DSDA or inter-band CA scenarios). For signals entirely in the first frequency band, the control component 130 is configured to select one of the PAs $112_{1,1}$ or $112_{1,2}$ of the first power amplification component $110_1$, and for signals entirely in the second frequency band, the control component 130 is configured to select one of the PAs $112_{2,1}$ or $112_{2,2}$ of the second power amplification component $110_2$. For signals in both the first frequency band and the second frequency band, however, control component 130 is configured to select one of the PAs $112_{1,1}$ or $112_{1,2}$ of the first power amplification component $110_1$ and to select one of the PAs $112_{2,1}$ or $112_{2,2}$ of the second power amplification component $110_2$.

Control component 130 can also be configured to determine a set of predefined criteria, which can be based at least in part on the information associated with the input RF signal(s), and control component 130 can be configured to select the one or more PAs based at least in part on the set of predefined criteria. Additionally, control component 130 can be configured to dynamically determine the set of predefined criteria, and dynamically re-select the one or more PAs as appropriate based at least in part on the set of predefined criteria. For example, for an input RF signal over a period of time, control component 130 can be configured to select a first set of one or more PAs during a first portion of the period of time, and to select a second set of one or more PAs during a second portion of the period of time. Predefined criteria discussed herein can include present values, derived values (e.g., time averaged values, etc.), or both. In aspects, dynamic calibration can be employed on a continuous basis, or intermittently (e.g., every X milliseconds/frames/time slots, at variable time intervals, at intervals determined based on the input RF signal(s), etc.).

Additionally, in some aspects, hysteretic techniques can be employed to minimize rapid changing of the one or more selected PAs (e.g., changes based on certain predefined criteria, but not changes based on CA mode, and in aspects, not changes based on other predefined criteria). For example, instead of changing selected PAs (e.g., from selection of a first PA to a second PA, or from selection of one first PA/second PA pair to a different first PA/second PA pair, etc.) at comparable values (or comparable sets of predefined criteria, etc.) in both directions (e.g., from first PA to second PA on the one hand, and second PA to first PA on the other, or between combinations), changes can require a PA or combination of PAs to be advantageous (e.g., based on the set of predefined criteria, or a subset thereof) by at least a threshold amount, for at least a threshold time, or both, before selection. However, control component 130 can be configured such that other changes (e.g., changes in present CA mode, etc.) can be associated with changes in selection without hysteresis.

The set of predefined criteria can include projected net current consumptions that would be associated with selecting various PAs ($112_{1,1}$, $112_{1,2}$, $112_{2,1}$, and $112_{2,2}$) or combinations of those PAs (e.g., $112_{1,1}$ and $112_{2,2}$, $112_{1,2}$ and $112_{2,1}$, etc.). For example, for single carrier and intra-band CA scenarios, control component 130 can be configured to select a PA based at least in part on which of the PAs in the relevant frequency band has a lower projected net current consumption. Similarly, for inter-band CA scenarios, control component 130 can be configured to select PAs based at least in part on which combination of PAs (e.g., $112_{1,1}$ and $112_{2,2}$, $112_{1,2}$ and $112_{2,1}$, etc.) has a lower projected net current consumption. By analyzing the net current consumption, gains can be realized over just analyzing the current consumption associated with ET mode or just analyzing the current consumption with APT mode. For example, PA $112_{1,1}$ might have a lower current consumption than PA $112_{2,1}$ (both coupled to the first (ET) DC-to-DC converter $120_1$). However, for an RF input signal transmitted on both the first and second frequency bands, net current consumption can sometimes be reduced by selecting PA $112_{2,1}$ instead of PA $112_{1,1}$ for ET mode, when the reduction in current consumption from an associated selection of PA $112_{1,2}$ instead of PA $112_{2,2}$ for APT mode is greater than the increase in current consumption from selecting PA $112_{2,1}$ instead of PA $112_{1,1}$ for ET mode. Projected net current consumption can be determined based on any of a variety of factors. These factors can include projected output powers of the relevant PAs (PAs configured to operate in a frequency band associated with the input RF signal(s), i.e., PAs that might be selected), projected on time of the relevant PAs (e.g., for TDD operation, with time allocations split between the transmit and receive paths, etc.), associated frequency bands of the relevant PAs, as well as other factors.

Alternatively or additionally, the set of predefined criteria can include a set of signal characteristics associated with the input RF signal(s) (or subsets thereof, e.g., a first subset in the first frequency band, a second subset in the second frequency band, etc.). For single carrier and intra-band CA scenarios, depending on the set of signal characteristics, either ET mode (via selection of PA $112_{1,1}$ or PA $112_{2,1}$, depending on the frequency band) or APT mode (via selection of PA $112_{1,2}$ or PA $112_{2,2}$, depending on the frequency band) may be advantageous. For inter-band CA scenarios, depending on a set of signal characteristics, it may be more advantageous to operate the first power amplification component $110_1$ in ET mode and the second power amplification component $110_2$ in APT mode, or vice versa, which can involve a determination of trade-offs in terms of which combination is more advantageous based at least in part on the set of signal characteristics. The set of signal characteristics that control component 130 can be configured to determine can include the following characteristics associated with the RF input signal (and/or subsets thereof, e.g., a first subset in the first frequency band, a second subset in the second frequency band, etc.): spectrum, bandwidth (e.g., higher bandwidth may lead to more AMAM and AMPM conversion, and thus APT may be more appropriate), contiguity (e.g., for signals with multiple component carriers, are they contiguous or non-contiguous, if not contiguous, by how much are they separated, etc.), a number of spectral clusters, one or more distances between spectral clusters, or a modulation scheme (e.g., quadrature phase-shift keying (QPSK); various types of quadrature amplitude modulation (QAM) such as 16QAM, 64QAM, 256QAM, etc.; or other modulation schemes), etc.

Depending on the PAs included in system 100, different selections of one or more PAs can be made for various scenarios. As discussed, to enable ET in both frequency bands, both PA $112_{1,1}$ and PA $112_{2,1}$ are included; likewise, to enable APT in both frequency bands, both PA $112_{1,2}$ and PA $112_{2,2}$ are included (however, in some embodiments, such as those discussed in connection with FIG. 2, ET and/or APT can be enabled in both bands in other ways via DC-to-DC converters $120_1$ and $120_2$). When each power amplification component $110_1$ and $120_2$ includes only one PA ($112_{1,1}$ and $112_{2,2}$, respectively, or $112_{2,1}$ and $112_{2,2}$), the determination of selected PAs can be based on the determined CA mode. When one power amplification component $110_1$ or $110_2$ includes two PAs and the other includes one PA (e.g., first or second), then selection can be based on the CA mode in some scenarios (e.g., inter-band CA, or single carrier or intra-band CA when in the frequency band associated with the power amplification component with a single PA), and can be based at least in part on the CA mode and on the set of predefined criteria in other scenarios (e.g., single carrier or intra-band CA when in the frequency band associated with the power amplification component with two PAs).

When each power amplifier has two PAs, both ET mode and APT can be employed in each frequency range. When the transmission mode is a single carrier mode (i.e., one active SIM and only one wireless technology employed, no CA), only one of the PAs is needed due to transmission in a single frequency band. Depending on the frequency band, a PA from the first power amplification component $110_1$ or a PA from the second power amplification component $110_2$ can be selected. Selection between the first or second PA of that power amplification component can be based at least in part on the set of predefined criteria. In a simplified example provided for the purposes of illustration (considering only net current consumption and only the effect of output power on net current consumption), at higher output power, ET mode can provide lower current consumption, and can be selected, while at lower power (e.g., 15 dBm or less), APT mode might provide lower current consumption and can be selected (in other scenarios, other predefined criteria can additionally or alternatively be used for selection). When the transmission mode is intra-band CA, again, only one PA is needed due to the transmission being within a single frequency band, and selection between PAs within that frequency band can be based at least in part on the set of predefined criteria. When the transmission mode is inter-band CA or a mode such as DSDA that employs multiple wireless technologies, one PA from each of the first power amplification component $110_1$ and the second power amplification component $110_2$ is selected. Determination of which of the first PAs (e.g., ET mode) and which of the second PAs (e.g., APT mode) is selected can be based at least in part on the set of predefined criteria. In a simplified example provided for the purposes of illustration, the second PA $112_{1,2}$ or $112_{2,2}$ (e.g., configured to operate in the APT mode) in the relevant frequency band is selected when the total aggregated bandwidth during intra-band CA operation exceeds the maximum transmission bandwidth supported by the first (e.g., ET mode) DC-to-DC converter $120_1$.

In addition to the reduced cost and PCB area of embodiments discussed herein, embodiments also provide improved isolation of the supply domains of active PAs. Separation of PA supply domains to maximize isolation is a significant issue in uplink CA systems. The leakage power at the supply pin of the PA is typically around 0dBm, and if the supply voltages of different active PAs are tied together at a single DC-to-DC converter, RF leakage can occur between the PAs, causing intermodulation issues. In some embodiments discussed herein, however, because at most one first PA $112_{i,1}$ is selected and at most one second PA $112_{i,2}$ is selected, each DC-to-DC converter is coupled to only one active PA, providing isolation between active PAs. In other embodiments, however, more than one first PA $112_{i,1}$ can be selected and/or more than one second PA $112_{i,2}$ can be selected (or, in embodiments discussed further herein, more than one third PA, etc. can be selected), and one or more filters (not shown) can be included to reduce the RF leakage and intermodulation issues (for example, each active first PA $112_{i,1}$ can transmit in a distinct frequency band, and likewise with each second PA $112_{i,2}$, etc., which can allow minimization of RF leakage via frequency-dependent filtering).

Although, for ease of illustration and discussion, only two power amplification components $110_1$ and $110_2$ are shown and discussed, in various embodiments, three or more power amplification components can be included in system 100, each associated with its own distinct frequency band (e.g., low, mid, high, etc.). The operation of such embodiments is substantially as described in connection with the embodiment shown in FIG. 1, providing for single carrier and intra-band CA operation in any of the frequency bands as described above. For inter-band CA or mult-SIM modes, any two of the power amplification components can be selected based on the relevant frequency bands, and those two selected power amplification components and their respective PAs can operate as described above in connection with the first and second power amplification components $110_1$ and $110_2$.

Figure 2:
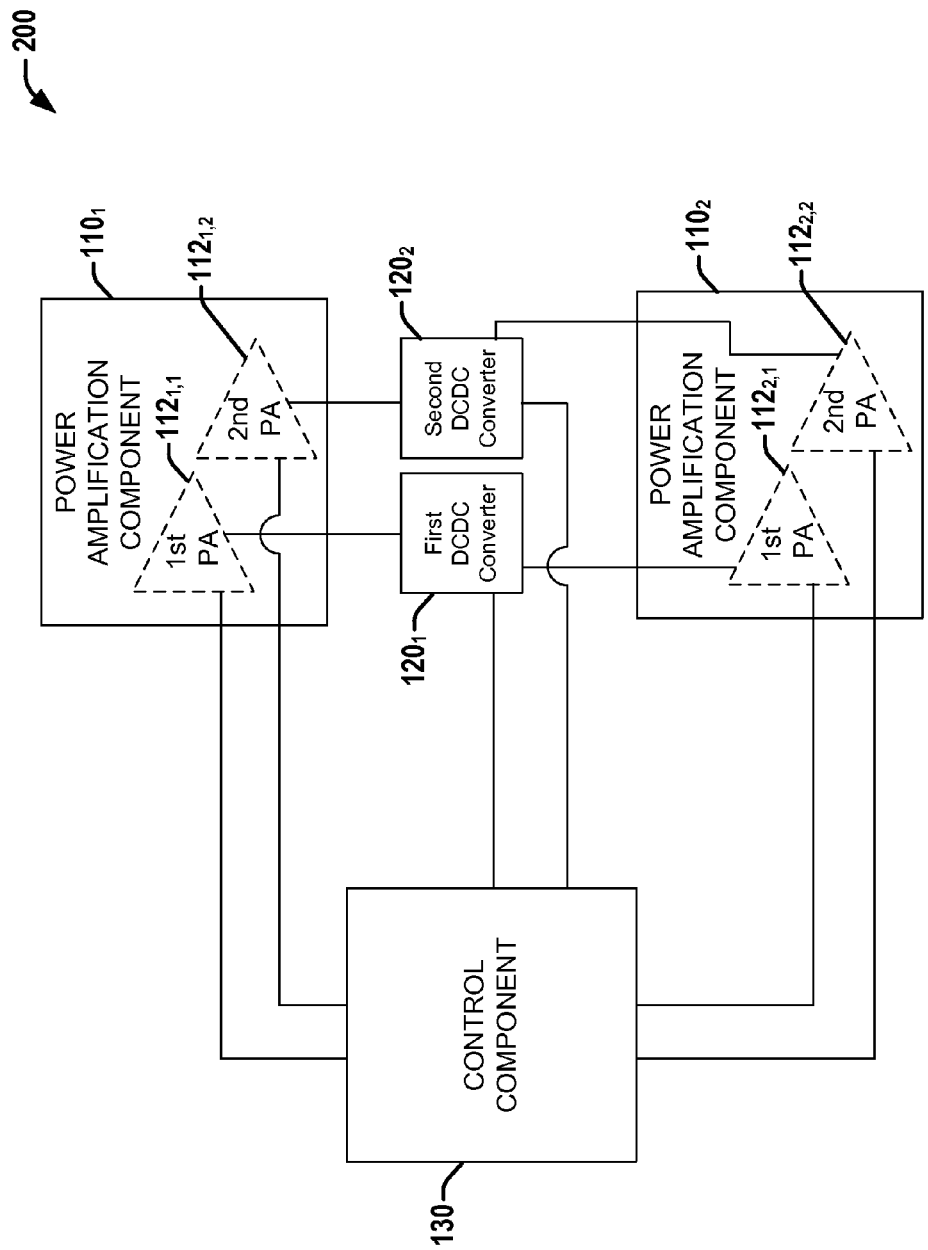
FIG. 2 is a block diagram illustrating another system or device that facilitates ET in connection with simultaneous transmission in up to two frequency bands according to various aspects described herein.

Referring to FIG. 2, illustrated is a block diagram of another system 200 that facilitates envelope tracking (ET) in connection with simultaneous transmission in up to two frequency bands according to various aspects described herein. System 200 is similar to system 100, with like reference numerals referring to like elements. Additionally, in system 200, control component 130 is coupled to at least one of the first DC-to-DC converter $120_1$ or the second DC-to-DC converter $120_2$. Each DC-to-DC converter coupled to control component 130 is configured to selectively provide its associated supply voltage according to either the ET mode or the APT mode. Control component 130 can be further configured to select between ET mode and APT mode for each DC-to-DC converter that is coupled to an active PA. Thus, in various embodiments of system 200, ET mode (or APT mode, or both modes) can be provided over all frequency bands with a lesser number of PAs than in system 100.

Figure 3:
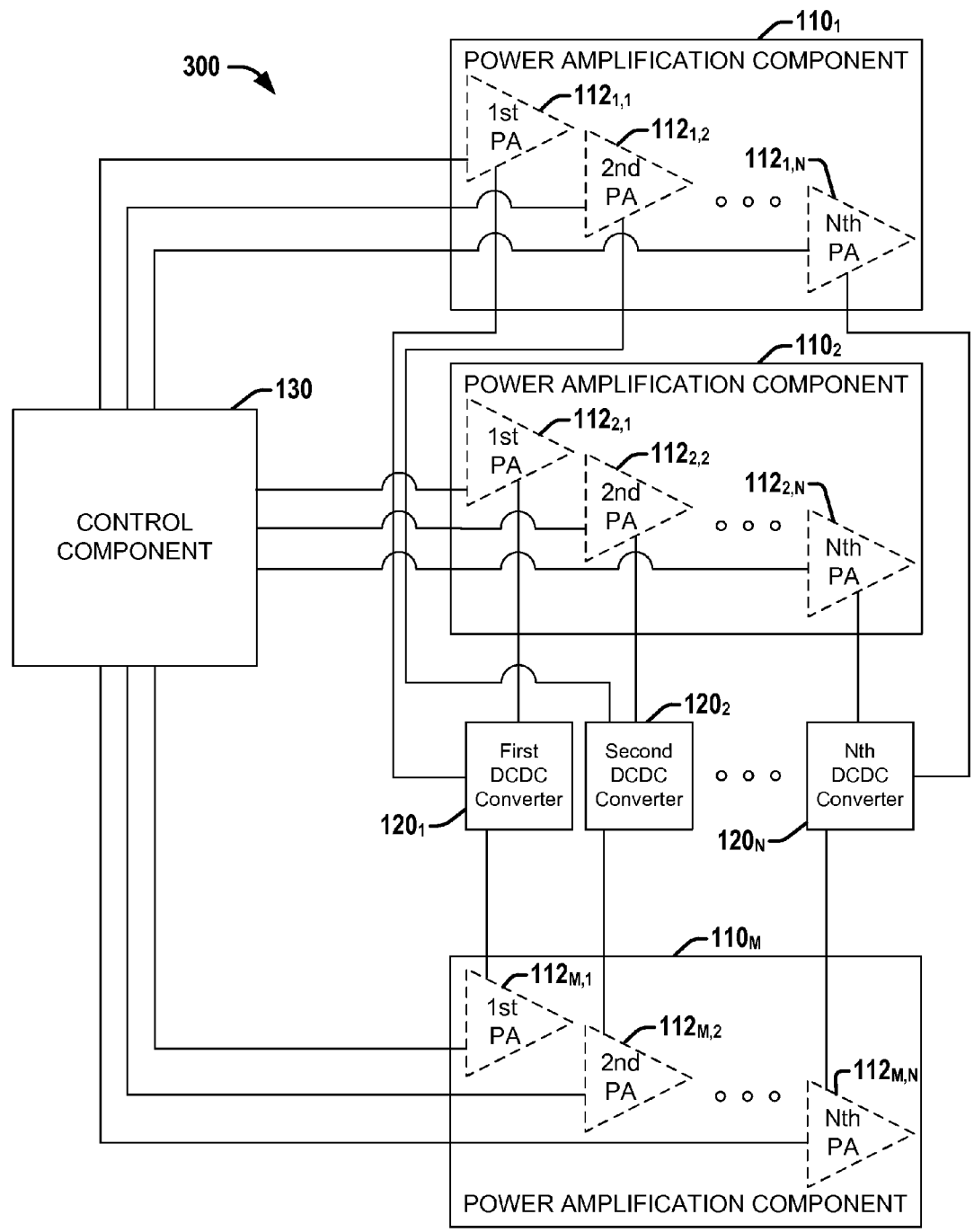
FIG. 3 is a block diagram illustrating another system or device that facilitates ET in connection with simultaneous transmission in one or more frequency bands according to various aspects described herein.

Referring to FIG. 3, illustrated is a block diagram of another system 300 that facilitates envelope tracking (ET) in connection with simultaneous transmission in one or more frequency bands according to various aspects described herein. System 300 can be similar in operation to system 100 or system 200 (although, for ease of illustration, no DC-to-DC converters 120 are shown as coupled to control component 130 in FIG. 3, in various embodiments, one or more DC-to-DC converters 120 can be coupled to control component 130, as described above in connection with system 200). Additionally, system 300 includes M (where M is any positive integer) power amplification components $110_1$ through $110_M$, each of which can be associated with a distinct frequency band of M frequency bands, and N (where N is any positive integer) DC-to-DC converters $120_1$ through $120_N$, each of which can provide an associated supply voltage (first through Nth), where each DC-to-DC converter is configured to operate according to at least one of the ET mode or the APT mode (DC-to-DC converters configured to operate in both modes can be coupled to control component 130, which can be configured to select between the ET mode and the APT mode). Each power amplification component $110_i$ can include one or more PAs of a first PA $112_{i,1}$ through Nth PA $112_{i,N}$. The first DC-to-DC converter $120_1$ is coupled to each included first PA $112_{i,1}$, the second DC-to-DC converter $120_2$ is coupled to each included second PA $112_{i,2}$, and similarly, through to the Nth DC-to-DC converter $120_N$, which is coupled to each included Nth PA $112_{i,N}$. The number of power amplification components $110_i$ (i.e., M) can be set to be the number of frequency bands for system 300 to operate in. The number of DC-to-DC converters $120_j$ (i.e., N) can be set to be the maximum number of PAs to be simultaneously active in system 300. For example, in LTE-A, a maximum of five component carriers can be employed in CA, thus N could be set as five or less for an LTE-A embodiment of system 300. N can be increased to support additional RATs or wireless technologies in various transmission modes (e.g. multi-SIM modes such as DSDA, etc. For example, N could be six or less for a DSDA embodiment of system 300 involving LTE-A and an additional RAT operating in a single frequency band. In embodiments involving higher numbers of multi-SIM multiple access than DSDA or other potential future RATs or wireless technologies wherein more than five component carriers may be employable in CA, N could have greater values.

When the transmission mode is single carrier (i.e., no CA or multi-SIM transmission, etc.), control component 130 can determine the frequency band to be used (e.g., one associated with power amplification component $110_i$, etc.), and can select a PA $112_{i,j}$ based at least in part on the set of predefined criteria, for example, by selecting a supply voltage mode (e.g., ET or APT) and then selecting a PA configured to operate in that mode. In embodiments in which two or more PAs in the power amplification component $110_i$ operate in the selected mode, selection among them can involve a default or random selection, etc. Alternatively, the two or more PAs in the power amplification component $110_i$ that operate in the selected mode can be configured in various ways, and selection can be based on the set of predefined criteria. For example, one PA can be better optimized for amplification of signals in a first part of the frequency band, another PA can be better optimized for amplification of signals in a second part of the frequency band, etc., and selection can be based at least in part on the spectrum of the input RF signal(s), etc. In aspects, PAs discussed herein that are configured to operate in the same frequency band (e.g., two or more PAs operating in the first frequency band, etc.) can each be configured to operate over the entire frequency band, or can be configured to operate over only a portion of the frequency band associated with the PA. For example, for two PAs both configured to operate in the same (e.g., first) frequency band, both can be configured to operate over the entire frequency band, one can be configured to operate over the entire frequency band (e.g., an APT mode PA, etc.) and one to operate over only a portion of the frequency band (e.g., an ET mode PA, for example, wherein two or more ET mode PAs are provided to cover the entire frequency band), or each can be configured to operate over only a respective portion of the frequency band (e.g., where those respective portions can be the same portion, distinct and overlapping portions, distinct and non-overlapping portions, etc.).

When the transmission mode is intra-band CA, control component 130 can again determine the frequency band to be used (e.g., one associated with power amplification component $110_i$, etc.), and can select a PA $112_{i,j}$ based at least in part on the set of predefined criteria, such as described above in connection with intra-band operation of system 100. In embodiments in which two or more PAs in the power amplification component $110_i$ operate in the selected mode, selection can be as described above in connection with single carrier mode operation of system 300 (e.g., default, random, based on predefined criteria, etc.). Additionally or alternatively, in some embodiments, a plurality of the two or more PAs of the power amplification component $110_i$ that operate in the selected mode can be configured to operate simultaneously. In such embodiments, control component 130 can select a single PA or more than one PA of the power amplification component $110_i$ based at least in part on the set of predefined criteria. For example, if the input RF signal comprises a plurality of contiguous component carriers and one other component carrier not contiguous with the plurality of contiguous component carriers, one PA (e.g., configured to operate in APT mode) could be selected to amplify the plurality of contiguous component carriers, while another PA (e.g., configured to operate in ET mode) could be selected to amplify the other component carrier.

When the transmission mode involves inter-band CA or a multiple technology transmission mode (e.g., a multi-SIM mode, etc.), control component 130 can determine the frequency bands to be used, and can select a PA configured to operate in each of those frequency bands (or more than one PA, in embodiments as described above in connection with intra-band CA operation of system 300), based at least in part on the set of predefined criteria (as described above, when more than one PA in a given frequency band operates in a mode selected for that frequency band, selection between those PAs can be based on default selections, random, based on the set of predefined criteria, etc.).

As an illustration of aspects described herein, one example embodiment of system 300 includes three power amplification components $110_1$, $110_2$, and $110_3$, comprising (in the respective power amplification component indicated via the PA subscripts) first PAs $112_{1,1}$, $112_{2,1}$, and $112_{3,1}$ configured to operate in the ET mode, second PAs $112_{1,2}$ and $112_{2,2}$ configured to operate in the APT mode, and third PAs $112_{1,3}$ and $112_{3,3}$ configured to operate in the APT mode, with each first PA coupled to a first DC-to-DC converter $120_1$ configured to operate in the ET mode, each second PA coupled to a second DC-to-DC converter $120_2$ configured to operate in the APT mode, and each third PA coupled to a third DC-to-DC converter $120_3$ configured to operate in the APT mode. This example embodiment comprises only a single ET tracker, but can provide ET operation in any of the first, second, or third frequency bands, while providing for uplink CA in intra-band or inter-band modes or transmission modes involving multiple wireless technologies or RATs. Inter-band CA or multiple technology transmission modes (e.g., multi-SIM transmission, etc.) in any two of the three frequency bands can be via a pair of PAs operating in either ET mode and APT mode or in APT mode and APT mode (wherein selection can be based at least in part on the set of predefined criteria), and inter-band CA or multi-SIM transmission (or a combination thereof, such as DSDA wherein one of the RATs involves inter-band CA in two frequency bands) can also be enabled in all three frequency bands simultaneously, with one PA in ET mode and two others in APT mode (wherein selection of which PA operates in ET mode can be based at least in part on the set of predefined criteria).

As additional examples, with two DC-to-DC converters 120 configured to operate in the ET mode (e.g., first and second), simultaneous ET mode operation over two frequency bands (and potentially APT mode over one or more other frequency bands) can be facilitated, in combinations of frequency bands based on which PAs 112 are coupled to the two DC-to-DC converters 120 configured to operate in the ET mode, and so on with three, etc.

Figure 4:
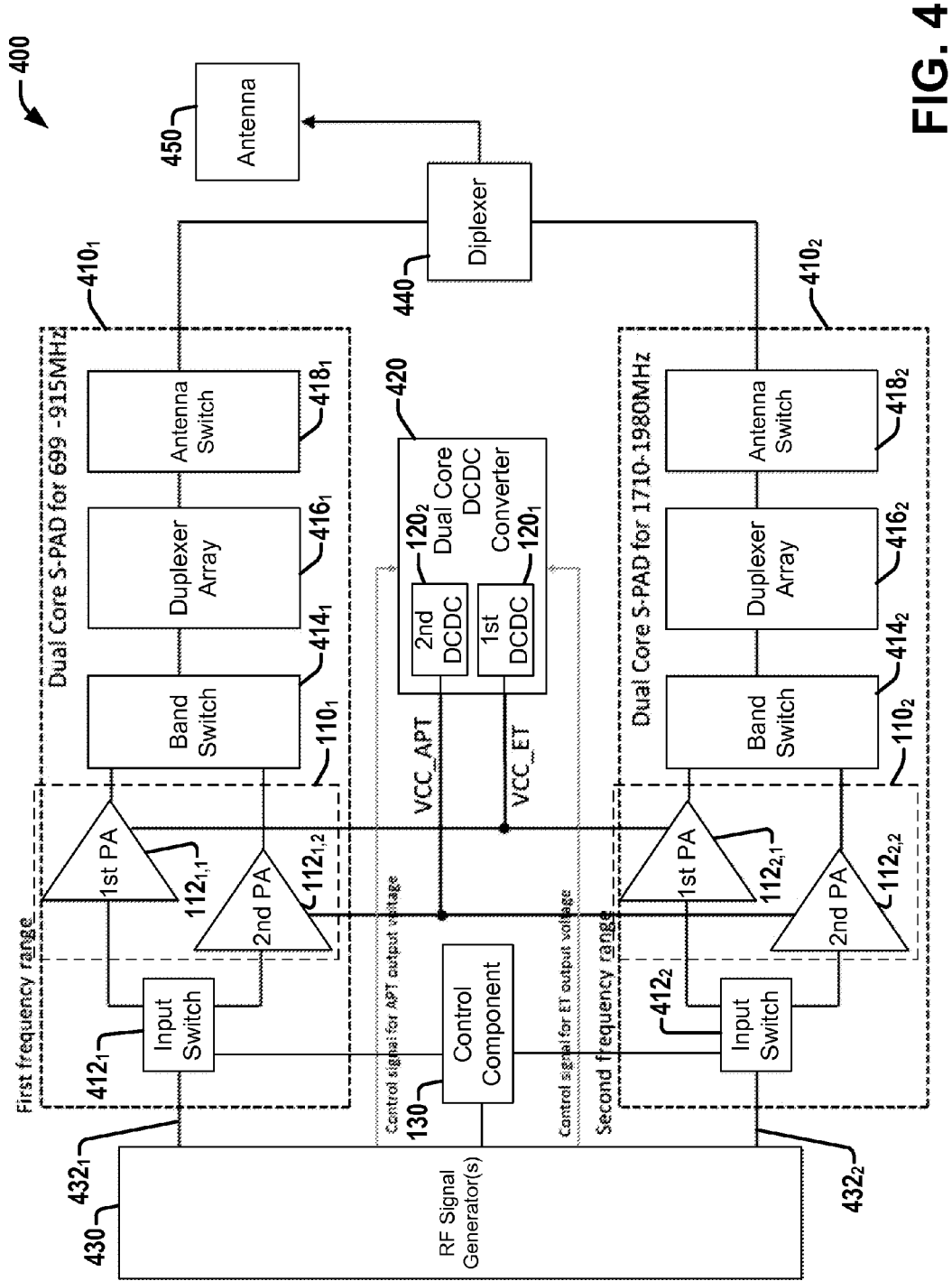
FIG. 4 is a block diagram illustrating an example embodiment of a system or device that facilitates ET in connection with simultaneous transmission in up to two frequency bands according to various aspects described herein.

Referring to FIG. 4, illustrated is a block diagram of an example embodiment of a system 400 that facilitates envelope tracking (ET) in connection with simultaneous transmission in up to two frequency bands according to various aspects described herein. System 400 is another example embodiment illustrating aspects described herein, comprising a control component 130, a first dual core switchable PA with integrated duplexer module (S-PAD) $410_1$, a second dual core S-PAD $410_2$, a dual core DC-to-DC converter 420, at least one RF signal generator 430, a diplexer 440, and an antenna 450. S-PAD $410_1$ is configured to operate in a first frequency range (e.g., 699-915 MHz), and comprises an input switch $412_1$, first power amplification component $110_1$ (comprising first PA $112_{1,1}$ and second PA $112_{1,2}$), band switch $414_1$, duplexer array $416_1$, and antenna switch $418_1$. S-PAD $410_2$ is configured to operate in a second frequency range (e.g., 1710-1980 MHz), and comprises an input switch $412_2$, second power amplification component $110_2$ (comprising first PA $112_{2,1}$ and second PA $112_{2,2}$), band switch $414_2$, duplexer array $416_2$, and antenna switch $418_2$. Dual core DC-to-DC converter 420 can include first DC-to-DC converter $120_1$ configured to operate in ET mode (with each first PA also configured to operate in ET mode) and second DC-to-DC converter $120_2$ configured to operate in APT mode (with each second PA also configured to operate in APT mode).

The at least one RF signal generator 430 can modulate or up-convert a baseband signal received from a baseband integrated circuit (IC) to generate at least one input RF signal. The input RF signal(s) or associated information can be provided to control component 130, which can select one or more PAs based at least in part on a present transmission mode, a set of predefined criteria, or both. The at least one RF signal generator is configured to send a first subset $432_1$ of the input RF signal(s) associated with the first frequency band (i.e., the portion of the signal(s) within the first frequency band, which could be, e.g., one of two signals in DSDA, the only signal in single carrier or intra-band CA, portions of the signal in the first frequency band in inter-band CA, etc.) to input switch $412_1$, and to send a second subset $432_2$ of the input RF signal(s) associated with the second frequency band (i.e., the portion of the signal within the second frequency band) to input switch $412_2$. Control component 130 is configured to send a control signal to either or both input switch $412_1$ or $412_2$, which are configured to couple the selected PA(s) to the first and/or second subsets of the input RF signal(s) $432_1$ or $432_2$. Band switches $414_1$ and/or $414_2$ can be included to pass the output of the selected PA(s) to the duplexer array $416_1$ and/or $416_2$, which can include filters for transmit (TX) and receive (RX) paths to separate transmitted and received signals in the frequency domain. Duplexer array $416_1$ and/or $416_2$ can be coupled, respectively, to antenna switch $418_1$ or $418_2$, which can couple the respective S-PAD $410_1$ and/or $410_2$ to the diplexer 440 (in embodiments with more than two power amplification components, a multiplexer can be employed), which can multiplex the two signals from $410_1$ and/or $410_2$ in the frequency domain, for subsequent transmission via antenna 450.

Figure 5:
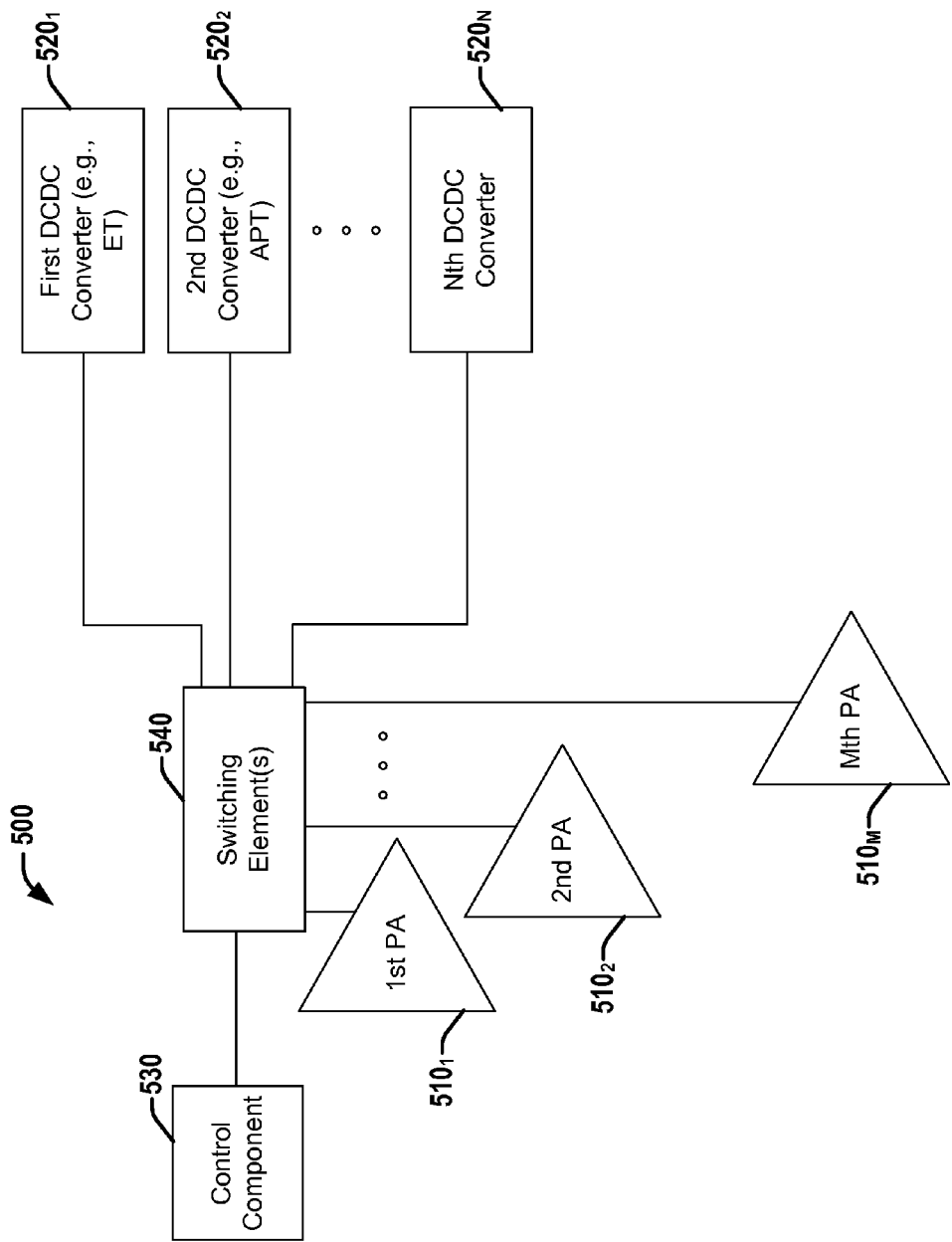
FIG. 5 is a block diagram illustrating an alternative embodiment of a system or device that facilitates ET in connection with simultaneous transmission in one or more frequency bands according to various aspects described herein.

Referring to FIG. 5, illustrated is a block diagram of an alternative embodiment of a system 500 that facilitates envelope tracking (ET) in connection with simultaneous transmission in one or more frequency bands according to various aspects described herein. The alternative embodiment of system 500 can comprise a plurality of PAs $510_1$ through $510_M$, a second plurality of DC-to-DC converters $520_1$ through $520_N$, a control component 530, and one or more switching elements 540.

Each PA 510 is configured to operate in a respective frequency band (e.g., first, second, . . . , Mth), can be configured to operate in at least one of the ET mode and the APT mode, similar to PAs 112 described in connection with FIGS. 1-4, and is coupled to the one or more switching elements 540. Each DC-to-DC converter 520 is configured to provide an associated supply voltage (e.g., the first DC-to-DC converter $520_1$ is configured to provide a first supply voltage, etc.) and to operate in at least one of the ET mode and the APT mode, and is coupled to the one or more switching elements 540. Control component 530 is configured to select at least one PA 510 and at least one DC-to-DC converter 520, and the one or more switching elements are configured to couple the at least one selected PA 510 with the at least one selected DC-to-DC converter 520, which can provide its supply voltage to the coupled selected PA 510.

When operating in a single carrier mode, a single PA 510 is selected (i.e., one configured to operate in the frequency band encompassing the single carrier), and a single DC-to-DC converter 520 is selected, wherein the DC-to-DC converter 520 can be selected (e.g., between ET mode and APT mode, etc.) based at least in part on the set of predefined criteria as described herein. Similarly, when operating in intra-band CA mode, a single PA 510 and a single DC-to-DC converter 520 can be selected, with the DC-to-DC converter 520 selected based at least in part on the set of predetermined criteria. For inter-band CA mode or multiple wireless technology (e.g., multi-SIM, etc.) transmission modes (or combinations thereof), a PA 510 can be selected for each frequency band of the input RF signal(s), and a DC-to-DC converter 520 can be selected for (and coupled to, via the one or more switching elements 540) each selected PA 510, wherein the selection of DC-to-DC converters 520 and which selected DC-to-DC converter 520 to couple to which selected PA 510 can be based at least in part on the predefined criteria.

The one or more switching elements 540 can have a cross switch topology with high linearity under large signal excitation (e.g., with voltage ranging from around 0.5 V to around 4.5 V, and current ranging from around a few mA to around 1 A), without distorting the voltage envelope.

Figure 6:
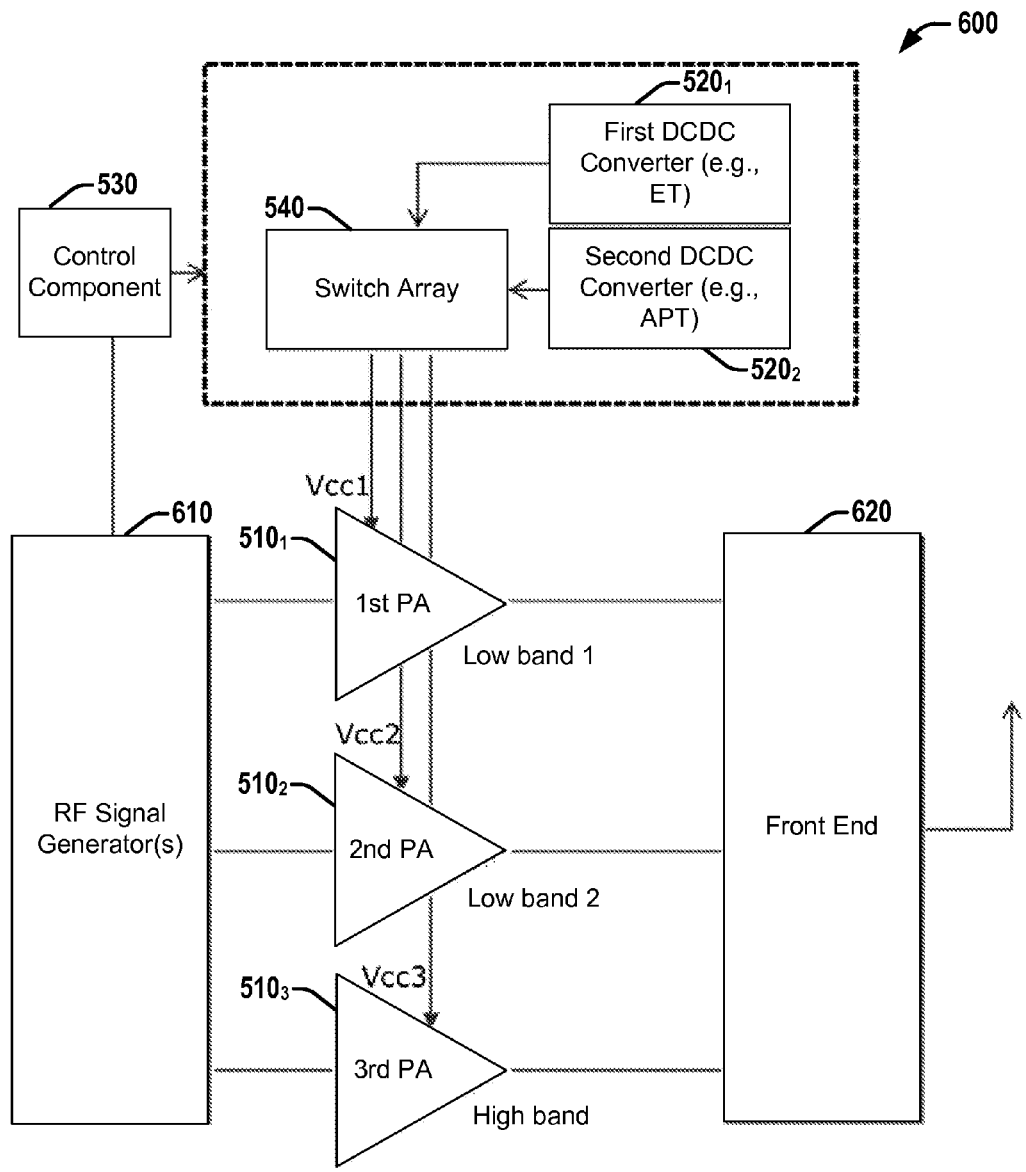
FIG. 6 is a block diagram illustrating an example alternative embodiment of a system or device that facilitates ET in connection with simultaneous transmission in up to two frequency bands according to various aspects described herein.

Referring to FIG. 6, illustrated is a block diagram of an example alternative embodiment of a system 600 that facilitates envelope tracking (ET) in connection with simultaneous transmission in one or more frequency bands according to various aspects described herein. System 600 is an example implementation of the alternative embodiment shown in FIG. 5. System 600 can include a first PA $510_1$ (first low band), second PA $510_2$ (second low band), and third PA $510_3$ (high band); first DC-to-DC converter $520_1$ (e.g., configured to operate in ET mode) and second DC-to- DC converter 520₂ (e.g., configured to operate in APT mode); control component 530; switch array (e.g., comprising one or more switching elements) 540; at least one RF signal generator 610; and RF front end 620. Because system 600 includes two DC-to-DC converters 520 and three PAs 510, system 600 can facilitate single carrier and intra-band modes in any of three frequency bands (first low, second low, high), as well as inter-band CA or other multi-band transmission modes (e.g., multi-SIM modes with two simultaneously active RATs (e.g., DSDA, etc.)), transmitting simultaneously on any two of the three frequency bands.

When operating in single carrier mode, control component 530 can select (and switch array 540 can couple) one of the PAs 510 (e.g., based on the transmission mode and/or the set of predefined criteria, e.g., based on the frequency band of the single carrier mode) with one of the DC-to-DC converters 520, which can be selected based at least in part on the set of predefined criteria. The at least one RF signal generator 610 can provide the input RF signal to the selected PA 510, which can amplify the RF signal, and provide it to RF front end 620 that can filter (e.g., via a duplexer, to separate TX an RX signals in the frequency domain) the RF signal and provide it to an antenna for transmission. For intra-band CA as the transmission mode, the operation is similar, with the selection of the DC-to-DC converter 520 (e.g., ET mode or APT mode) based at least in part on the set of predefined criteria. For inter-band CA or other multi-band (e.g., multi-SIM, etc.) transmission modes (e.g., DSDA), the control component 530 can select the two PAs 510 corresponding to the two frequency bands of the transmission mode, and can select (e.g., based at least in part on the set of predefined criteria) one of them to be coupled to the first DC-to-DC converter 520₁ (e.g., ET mode) via the switch array 540, and the other to be coupled to the second DC-to-DC converter 520₂ (e.g., APT mode) via the switch array 540.

Figure 7:
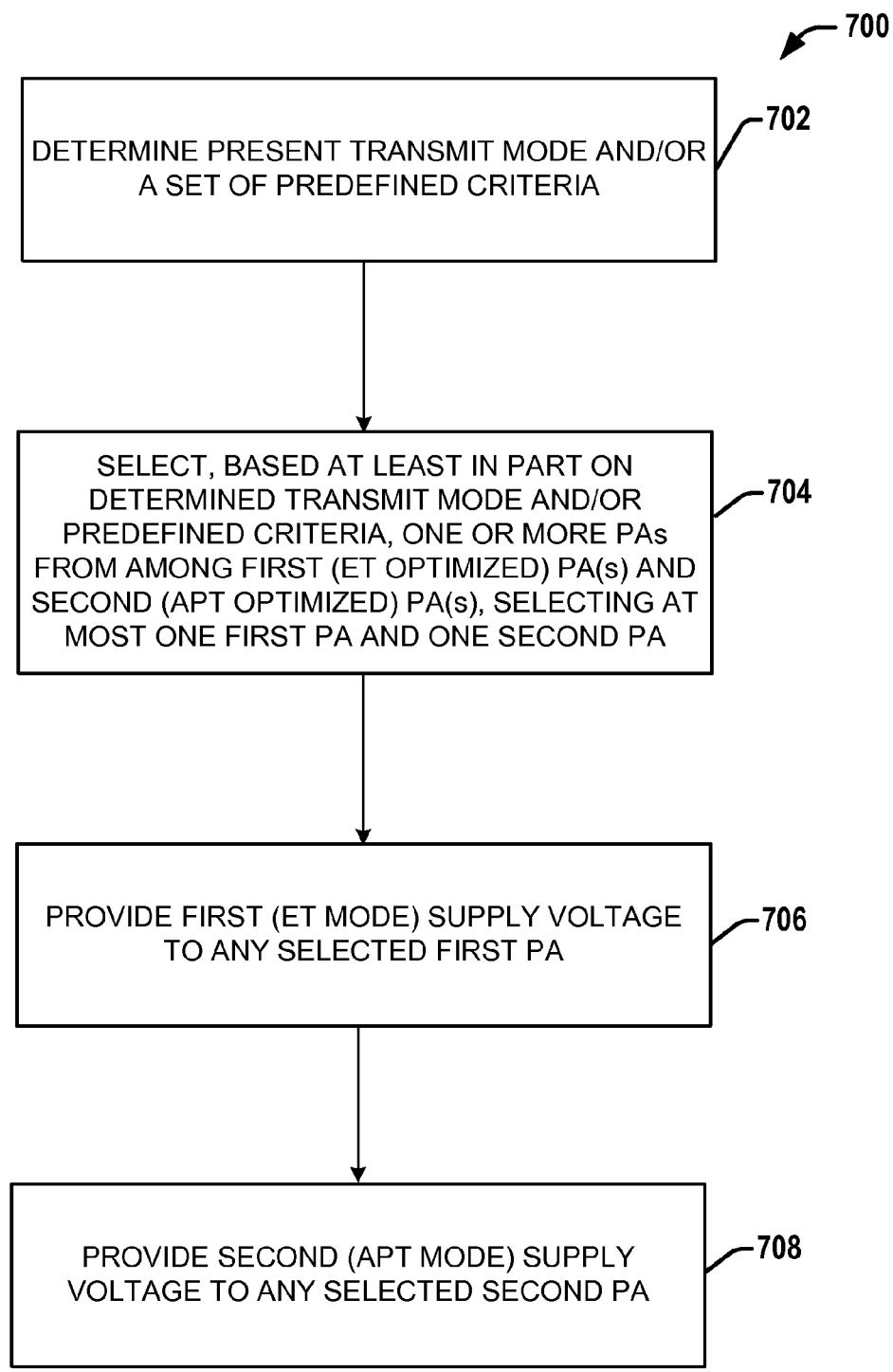
FIG. 7 is a flow diagram illustrating a method that facilitates ET in connection with simultaneous transmission in up to two frequency bands according to various aspects described herein.

Referring to FIG. 7, illustrated is a flow diagram of a method 700 that facilitates ET in connection with simultaneous transmission in up to two frequency bands according to various aspects described herein. Method 700 can include, at 702, determining at least one of a present transmission mode and a set of predefined criteria, which can be as described herein, and which can be determined from an input RF signal or associated information. Predetermined criteria can include any described herein, such as present values, derived values, etc. of projected net current consumptions, signal characteristics, etc. At 704, method 700 can include selecting one or more PAs from among a set of first PAs and a set of second PAs, selecting at most one first PA (i.e., zero or one) and at most one second PA (i.e., zero or one), which can be based at least in part on the determined at least one of the present transmission mode and the set of predefined criteria. Each first PA of the set of first PAs can be configured to operate in the ET mode in a distinct frequency band (e.g., first, second, etc., or low, high, etc.), and can be associated with a second PA of the set of second PAs configured to operate in the APT mode in the same distinct frequency band. Alternatively, at least one of the first PAs need not be associated with a second PA, and/or at least one of the second PAs need not be associated with a first PA. At 706, a first supply voltage according to the ET mode can be provided to any selected first PA (i.e., to the selected first PA when a first PA is selected). At 708, a second supply voltage according to the APT mode can be provided to any selected second PA (i.e., to the selected second PA when a second PA is selected). In various aspects, method 700 can be dynamically performed on an ongoing basis, such as continuously, intermittently, etc. Thus ET can be enabled in connection with simultaneous transmission in one or more frequency bands. In a single carrier or intra-band CA transmission mode, a first PA or a second PA can be selected, with selection performed as described herein (e.g., selecting the first (ET) PA when appropriate, etc.). In an inter-band CA transmission mode or other multi-band transmission modes (e.g., multi-SIM mode such as DSDA, etc.), both a first PA and a second PA can be selected, again with selection performed as described herein (e.g., enabling ET mode in a frequency band selected based at least in part on the predefined criteria, etc.).

Figure 8:
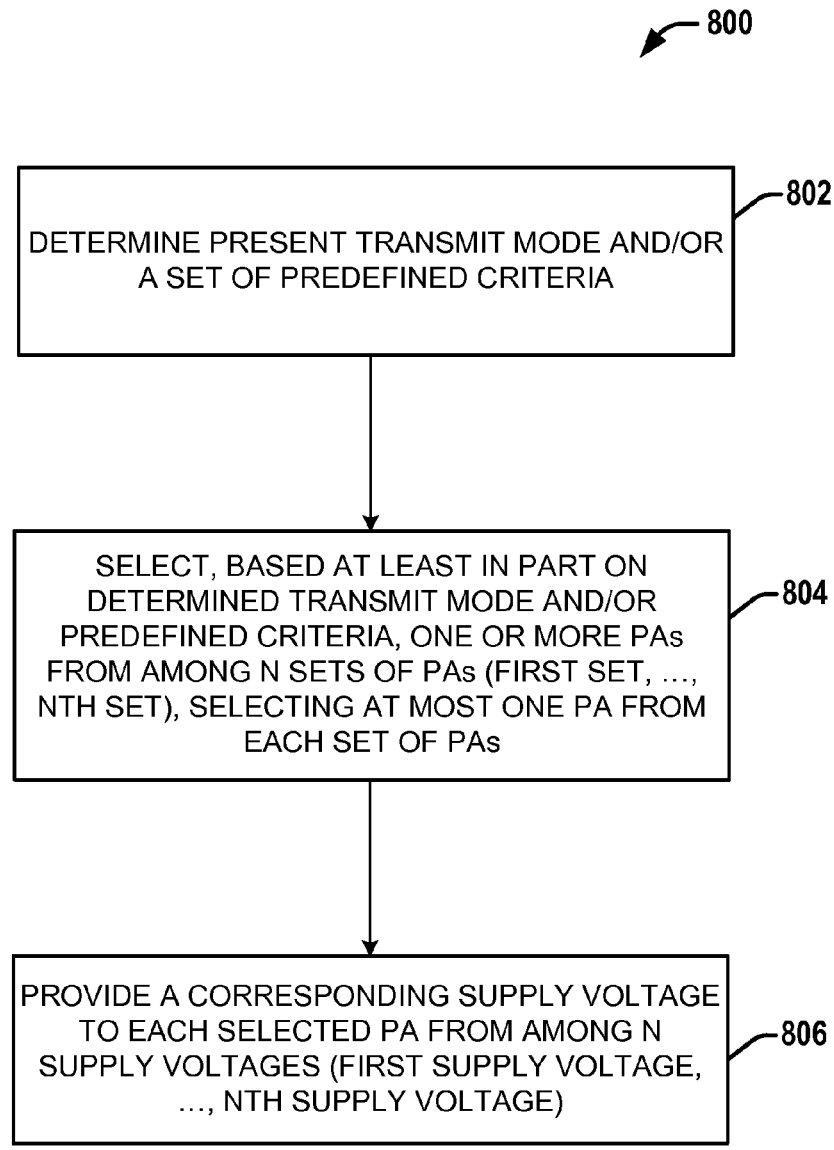
FIG. 8 is a flow diagram illustrating another method that facilitates ET in connection with simultaneous transmission in one or more frequency bands according to various aspects described herein.

Referring to FIG. 8, illustrated is a flow diagram of another method 800 that facilitates ET in connection with simultaneous transmission in one or more frequency bands according to various aspects described herein. At 702, at least one of the present transmission mode and the set of predefined criteria can be determined, as described herein. At 804, based at least in part on the determined present transmission mode and/or set of predefined criteria, one or more PAs can be selected from among N sets of PAs, selecting at most one PA from each set of PAs (e.g., zero or one PAs from the first set, zero or one from the second set, etc.), wherein each PA of a given set (e.g., each PA of the first set, etc.) is configured to operate on a distinct frequency band, and is associated with at most one PA from each of the other sets that is also configured to operate on the same distinct frequency band (i.e., for each frequency band, at most one PA from each set (first, second, etc.) is configured to operate on that frequency band). At 806, a corresponding supply voltage can be provided to each selected PA from among N supply voltages (e.g., when a PA is selected from the first set of PAs, the first supply voltage is provided to it; etc.). A corresponding DC-to-DC converter can be coupled to each PA of a given set of PAs (e.g., a first DC-to-DC converter coupled to each PA of the first set of PAs, etc.) and configured to provide the corresponding supply voltage (e.g., the first DC-to-DC converter is configured to provide the first supply voltage, etc.). Method 800 can provide for single carrier and intra-band CA transmission modes in any of the frequency bands associated with a set of PAs, in a manner similar to method 700. In addition, method 800 can provide for inter-band CA or other multi-band (e.g., multi-SIM, etc.) transmission modes (or combinations thereof) simultaneously in up to N frequency bands, such as described above in connection with system 300.

Figure 9:
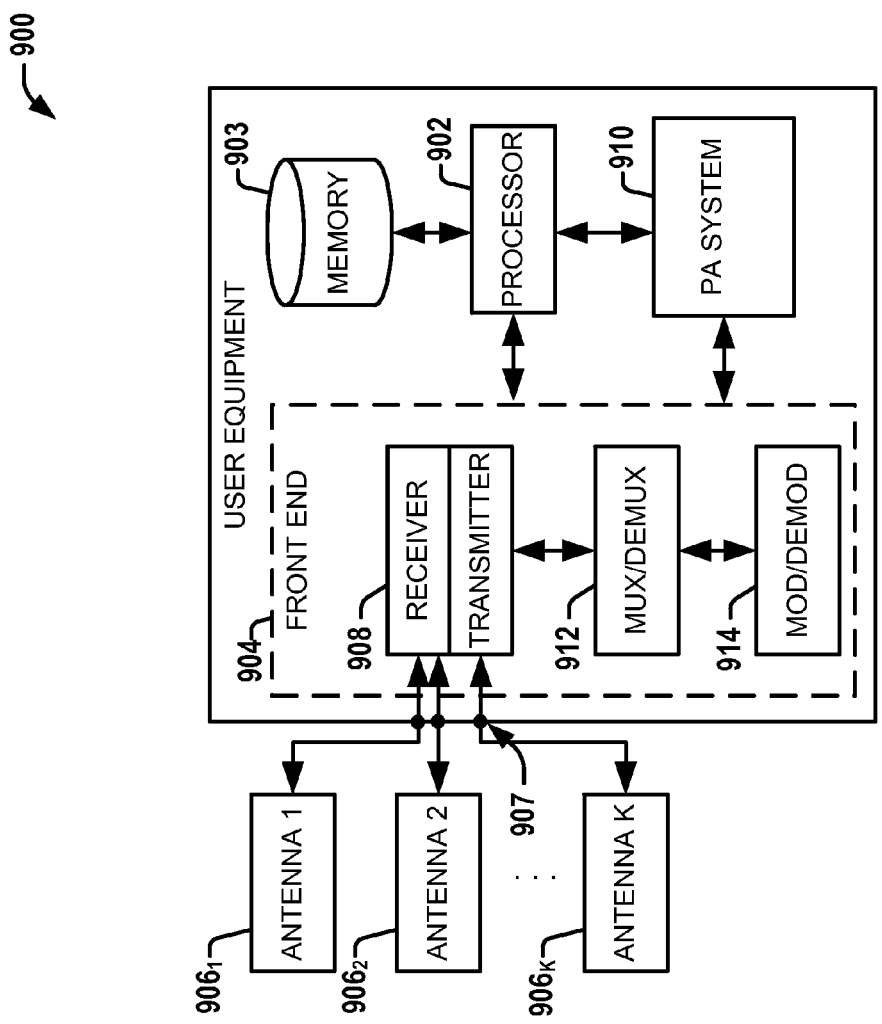
FIG. 9 is a block diagram illustrating an example user equipment useable in connection with various aspects described herein.

Referring to FIG. 9, illustrated is an exemplary user equipment or mobile communication device 900 that can be utilized with one or more aspects of the systems, methods, or devices that facilitate envelope tracking described herein according to various aspects. The user equipment 900, for example, comprises a digital baseband processor 902 that can be coupled to a data store or memory 903, a front end 904 (e.g., an RF front end, an acoustic front end, or the other like front end) and a plurality of antenna ports 907 for connecting to a plurality of antennas 906₁ to 906ₖ (k being a positive integer). The antennas 906₁ to 906ₖ can receive and transmit signals to and from one or more wireless devices such as access points, access terminals, wireless ports, routers and so forth, which can operate within a radio access network or other communication network generated via a network device. The user equipment 900 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 904 can include a communication platform, which comprises electronic components and associated circuitry that provide for processing, manipulation or shaping of the received or transmitted signals via one or more receivers or transmitters 908, a mux/demux component 912, and a mod/demod component 914. The front end 904, for example, is coupled to the digital baseband processor 902 and the set of antenna ports 907, in which the set of antennas $906_1$ to $906_k$ can be part of the front end. In one aspect, the user equipment 900 can comprise a PA system 910 that operates with a delay component for providing a delay between a main signal processing path and an envelope tracking path of a PA. The delay can be dynamically (re-) calibrated according to a feedback path from the PA output, for example. In aspects, PA system 910 can comprise a system as described herein that can facilitate ET in connection with simultaneous transmission in one or more frequency bands, providing for improved efficiency, such as by selectively employing ET and APT modes of operation, for example, based on at least one of a present transmission mode and a set of predefined criteria (e.g., signal characteristics, projected net current consumption, etc.).

The user equipment 900 can also include a processor 902 or a controller that can operate to provide or control one or more components of the user equipment 900. For example, the processor 902 can confer functionality, at least in part, to substantially any electronic component within the user equipment 900, in accordance with aspects of the disclosure. As an example, the processor can be configured to execute, at least in part, executable instructions that control various modes of the PA system 910 as a multi-mode operation chipset that affords different power generation operations for input signals at the antenna ports 907, an input terminal or other terminal based on one or more characteristics of the input signal.

The processor 902 can operate to enable the mobile communication device 900 to process data (e.g., symbols, bits, or chips) for multiplexing/demultiplexing with the mux/demux component 912, or modulation/demodulation via the mod/demod component 914, such as implementing direct and inverse fast Fourier transforms, selection of modulation rates, selection of data packet formats, inter-packet times, etc. Memory 903 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 902 is functionally and/or communicatively coupled (e.g., through a memory bus) to memory 903 in order to store or retrieve information necessary to operate and confer functionality, at least in part, to communication platform or front end 904, the PA system 910 and substantially any other operational aspects of the PA system 910. The PA system 910 includes at least one power amplifier in the RF front end 904 that can employ an envelope tracking mode of operation in order to improve an efficiency or battery life of the user equipment 900. While the components in FIG. 9 are illustrated in the context of a user equipment, such illustration is not limited to user equipment but also extends to other wireless communication devices, such as base station, small cell, femtocell, macro cell, microcell, etc.

Figure 10:
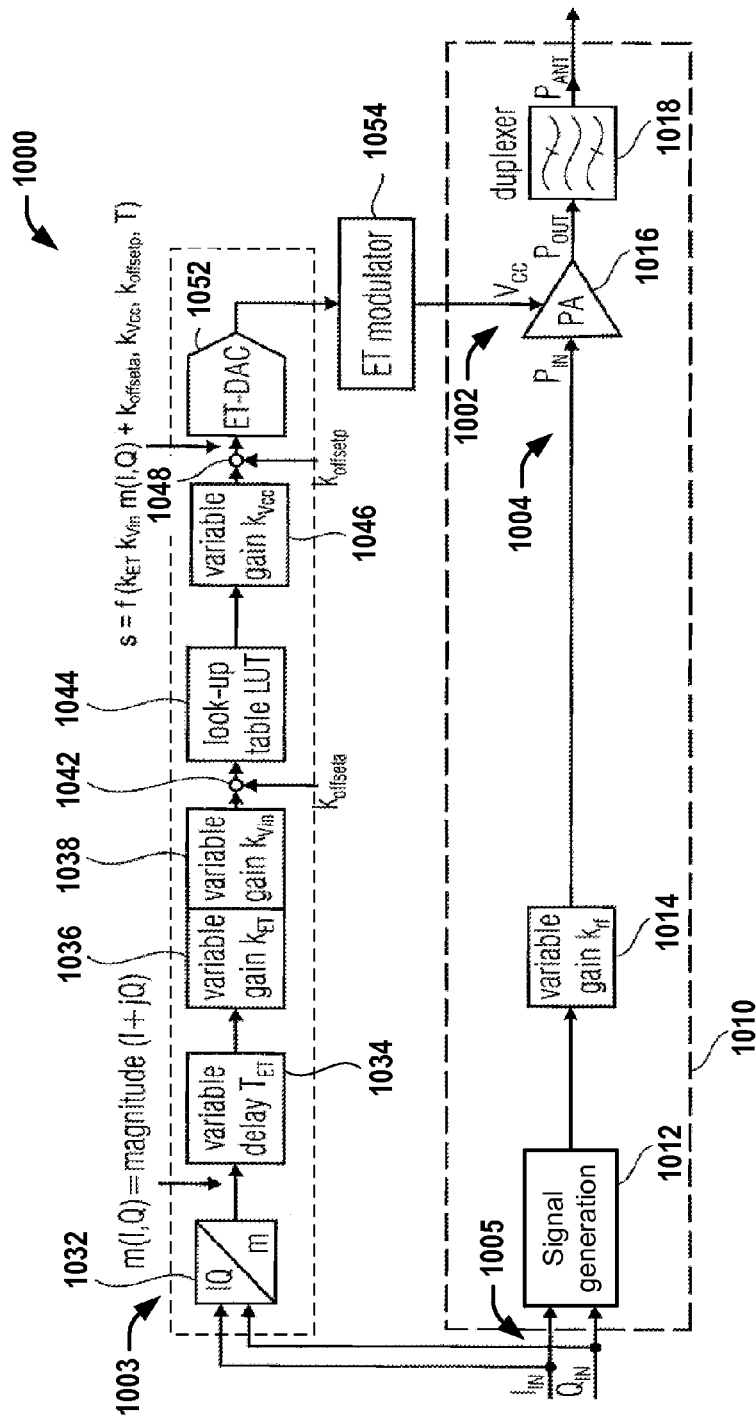
FIG. 10 is a block diagram illustrating a power amplifier (PA) capable of operating in an ET mode in connection with various aspects described herein.

Referring to FIG. 10, illustrated is a schematic block diagram of an envelope tracking system 1000 with a power amplifier 1016 that has an input terminal 1002 that is part of an envelope tracking pathway 1003 and an input terminal 1004 that is part of a signal generation pathway 1010. An input terminal 1005 or an input signal 1005 (e.g., a differential signal, a single ended signal, an RF signal, an acoustic signal, or other like communication signal) to be processed or transmitted, can comprise, for example, an in-phase component $I_{IN}$ and a quadrature component $Q_{IN}$. Alternatively or additionally, the input signal 1005 can comprise a different format as a single or a differential signal. The input signal 1005 is received by a signal generation path 1010 that comprises an RF signal generation component 1012, a variable gain element 1014, a power amplifier (PA) 1016, and a duplexer 1018. The signal generation component 1012 can be configured to perform frequency up-conversion, for example, from a baseband (BB) frequency range to a radio frequency range, or generate a different conversion operation, such as a digital-to-analog conversion of the input signal 1005. The variable gain element 1014 is configured to multiply an output of the signal generation component 1012 with a variable gain (e.g., $k_{rf}$) that serves to achieve a desired gain setting of the entire signal generation path 1014 as part of the power amplifier system 1000. The power amplifier 1016 amplifies the signal provided by the variable gain element 1014, wherein an input power of the PA 1016 is $P_{IN}$ and an output power is $P_{OUT}$. The amplified amplifier output signal (Pout) is then fed to the duplexer 1018, which separates transmitted and received signals in the frequency domain. At an antenna port of the duplexer 1018, the output signal is typically slightly attenuated to an antenna power $P_{ANT}$, compared to the output power $P_{OUT}$ of the power amplifier 1016.

One envelope tracking specific design target on a system level is a flat AMPM- and AMAM phase response of the PA 1016 versus PA supply voltage $V_{CC}$ and across output power (in this context PA supply voltage $V_{CC}$ refers to the voltage that is influenced by an envelope tracking operation, for example, the supply voltage of a $2^{nd}$ PA stage). The abbreviation AMPM stands for "amplitude-to-phase distortion" and the abbreviation AMAM stands for "amplitude-to-amplitude distortion".

The lookup table 1044 can be part of the envelope tracking path 1003 or a supply voltage processing path, which is depicted above the main signal generation path 1010. The supply voltage processing path 1003 is also considered a part of the envelope tracking system 1000. The supply voltage processing path 1003 can comprise a vector-to-magnitude converter 1032 (e.g., implementing a CORDIC algorithm, etc.). The instantaneous magnitude of the input signal 1005 can be expressed as m(I,Q)=magnitude (I,Q), which is forwarded to a variable delay element 1034 configured to delay the magnitude signal by a delay $T_{ET}$ to aid in synchronizing the variation in $V_{CC}$ with the envelope of the RF signal in the signal generation path 1010. The supply voltage processing path 1003 further comprises a variable gain element 1036 with a variable gain $k_{ET}$. The variable gain $k_{ET}$ can be synchronized with the variable gain $k_{rf}$ of the transmitter (not explicitly shown in FIG. 10). At a summing element 1042, an input signal offset $k_{offseta}$ is added before the signal is provided to a lookup table (LUT) 1044. The lookup table 1044 implements a nonlinear transfer function or at least the basic shape of the nonlinear transfer function. The supply voltage processing path 1003 further comprises a further variable gain element 1046 for applying a variable gain $k_{VCC}$ to an output signal of the lookup table 1044. At a further summing element 1048 an output signal offset $k_{offsetp}$ is added before the signal is digital-to-analog converted by an envelope tracking digital-to-analog converter (ET-DAC) 1052. An analog output signal of the ET-DAC 1052 is provided to the ET modulator 1054 (e.g., ET DC-DC voltage provider) as a variable or dynamic control signal and to cause the ET modulator 1054 to provide a corresponding supply voltage $V_{CC}$ to the envelope tracking power amplifier 1016 for providing an output voltage or output power signal at a maximum efficiency.

The delay of the delay component 1034 can be sensitive to part-to-part variations along the main signal processing path 1010 and the envelope tracking path 1003, as well as to aging and PVT dependencies, for example. Therefore, the delay is calibrated during production of the power amplifier system 1000 or of a communication device/transmitter/receiver/transceiver that comprises the power amplifier system 1000. In one aspect, re-calibration is dynamic and can be facilitated by the power system 1000 after production on-the-fly or in real-time during an active transmission or during active communications of the device in the field during an active transmission mode or an active mode of operation in order to compensate for the aging effects, PVT dependencies, or other variations.

In some instances, the variable delay may only be calibrated once during factory calibration for a 50 ohm termination. However, factory calibration has different limitations as follows: (1) the delay might change over time, and (2) the factory calibration process does not fully reflect real-life use cases of a mobile device (e.g., the antenna impedance does change depending on the position of the mobile communication device relative to the mobile device user). Antenna impedance change can also affect the PA behavior (e.g., for some antenna impedances the PA supply $V_{CC}$ has to be increased to maintain antenna output power and for other antenna impedances the PA supply Vcc needs to be decreased to reach the same output power). As a result, the actual delay or actual delay function of the delay component 1034 is subject to deviate from a target delay that was established during factory calibration in a calibration mode, for example, which is different from an active transmission mode in the field or thereafter. As such, these variations can cause degradation of an adjacent channel leakage ratio (ACLR) or an error vector magnitude (EVM) performance, for example. These conditions discussed above can be mitigated or avoided by dynamically re-adjusting the delay or the delay function of the delay component $T_{ET}$ 1034 according to various aspects described.

Several measures can be carried out to compensate possible delay changes. The power amplifier system 1000 can perform dynamic calibration or setting of the delay component 1034 in the envelope tracking path 1003 according to 1) a re-calibration during an active transmission or an active power generation mode of the power amplifier during operation, 2) on-the-fly re-calibration without interfering with the information inherent in the received input signal 1005 (e.g., an RF signal, acoustic signal or the like), or 3) on-the-fly re-calibration without violation of the spectral mask of the input signal 1005. In aspects, the subject innovation can provide such an ET mode over each (or some, in other aspects) frequency band, facilitating ET mode in connection with simultaneous transmission in one or more frequency bands.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a system for envelope tracking (ET) in connection with single-band or multi-band transmission, which includes a plurality of power amplification components, a first DC-to-DC converter, a second DC-to-DC converter, and a control component. Each power amplification component of the plurality of power amplification components is associated with a distinct frequency band. Each power amplification component of a first subset of the plurality of power amplification components comprises a first power amplifier (PA) configured to transmit in the distinct frequency band and configured to operate according to an ET mode of operation Each power amplification component of a second subset of the plurality of power amplification components comprises a second PA configured to transmit in the distinct frequency band and configured to operate according to an average power tracking (APT) mode of operation. The first DC-to-DC converter is configured to provide a first supply voltage according to the ET mode and coupled to each of the first PAs. The second DC-to-DC converter is configured to provide a second supply voltage according to the APT mode and coupled to each of the second PAs. The control component is configured to determine a present transmission mode and to select, based at least in part on the present transmission mode, one or more PAs of the plurality of power amplification components.

Example 2 includes the subject matter of example 1, wherein the one or more PAs comprise at most one of the first PAs and at most one of the second PAs.

Example 3 includes the subject matter of any one of examples 1 or 2, including or omitting optional features, wherein at least two of the plurality of power amplification components comprise both a first PA and a second PA.

Example 4 includes the subject matter of any one of examples 1-3, including or omitting optional features, wherein the control component is further configured to determine a set of predefined criteria, and wherein the control component selects the one or more PAs based at least in part on the set of predefined criteria.

Example 5 includes the subject matter of any variation of example 4, including or omitting optional features, wherein the set of predefined criteria comprise, for each of the one or more PAs, a first projected net current consumption associated with the first DC-to-DC converter providing the first supply voltage to the first PA of each power amplification component comprising at least one of the one or more PAs and a second projected net current consumption associated with the second DC-to-DC converter providing the second supply voltage to the second PA of each power amplification component comprising at least one of the one or more PAs.

Example 6 includes the subject matter of any variation of example 5, including or omitting optional features, wherein the first projected net current consumption is determined based at least in part on a first projected output power of the first PA of each power amplification component comprising at least one of the one or more PAs and on a second projected output power of the second PA of each power amplification component comprising at least one of the one or more PAs.

Example 7 includes the subject matter of any variation of any one of examples 5-6, including or omitting optional features, wherein the first and second projected net current consumptions are determined based at least in part on a comparison between the distinct frequency bands associated with each of the one or more PAs.

Example 8 includes the subject matter of any variation of any one of examples 4-7, including or omitting optional features, wherein each of the one or more PAs is configured to transmit a distinct input signal, wherein the set of predefined criteria comprise, for each of the one or more PAs, a set of signal characteristics associated with the distinct input signal, wherein the set of signal characteristics comprise one or more of a spectrum of the distinct input signal, a bandwidth of the distinct input signal, a contiguity of the distinct input signal, a number of spectral clusters of the distinct input signal, one or more distances between spectral clusters of the distinct input signal, or a modulation scheme associated with the distinct input signal.

Example 9 includes the subject matter of any variation of any example 8, including or omitting optional features, wherein the present transmission mode comprises an intra-band CA mode.

Example 10 includes the subject matter of any variation of any one of examples 8-9, including or omitting optional features, wherein the one or more PAs comprises a second PA of the set of second PAs when the bandwidth of the distinct input signal associated with the second PA exceeds a maximum supported bandwidth associated with the first DC-to-DC converter.

Example 11 includes the subject matter of any variation of any one of examples 4-10, including or omitting optional features, wherein the first DC-to-DC converter is further configured to provide the first supply voltage according to the APT mode, wherein the control component is further configured to select, based at least in part on the set of predefined criteria, between the first DC-to-DC converter providing the first supply voltage according to the ET mode and the first DC-to-DC converter providing the first supply voltage according to the APT mode.

Example 12 includes the subject matter of any variation of any one of examples 1-11, including or omitting optional features, wherein the present transmission mode comprises an inter-band CA mode, and wherein the one or more PAs comprise one of the first PAs and one of the second PAs, and wherein each of the one or more PAs is configured to simultaneously transmit in the distinct frequency band associated with that PA.

Example 13 includes the subject matter of any variation of any one of examples 1-12, including or omitting optional features, wherein the present transmission mode comprises a dual subscriber identity module (SIM) dual active mode, and wherein the one or more PAs comprise one of the first PAs and one of the second PAs, and wherein each of the one or more PAs is configured to simultaneously transmit in the distinct frequency band associated with that PA.

Example 14 includes the subject matter of any variation of any one of examples 1-13, including or omitting optional features, further comprising a third DC-to-DC converter configured to provide a third supply voltage according to a mode associated with the third DC-to-DC converter, wherein the mode associated with the third DC-to-DC converter is one of the APT mode or the ET mode, wherein each power amplification component of a third subset of the plurality of power amplification components comprises a third PA configured to transmit in the distinct frequency band and configured to operate according to the mode associated with the third DC-to-DC converter, wherein the third DC-to-DC converter is coupled to each of the third PAs, and wherein the control component selects at most one of the third PAs.

Example 15 includes the subject matter of example 1, including or omitting optional features, wherein at least two of the plurality of power amplification components comprise both a first PA and a second PA.

Example 16 includes the subject matter of example 1, wherein the control component is further configured to determine a set of predefined criteria, and wherein the control component selects the one or more PAs based at least in part on the set of predefined criteria.

Example 17 includes the subject matter of example 16, wherein the set of predefined criteria comprise, for each of the one or more PAs, a first projected net current consumption associated with the first DC-to-DC converter providing the first supply voltage to the first PA of each power amplification component comprising at least one of the one or more PAs and a second projected net current consumption associated with the second DC-to-DC converter providing the second supply voltage to the second PA of each power amplification component comprising at least one of the one or more PAs.

Example 18 includes the subject matter of example 17, wherein the first projected net current consumption is determined based at least in part on a first projected output power of the first PA of each power amplification component comprising at least one of the one or more PAs and on a second projected output power of the second PA of each power amplification component comprising at least one of the one or more PAs.

Example 19 includes the subject matter of example 17, wherein the first and second projected net current consumptions are determined based at least in part on a comparison between the distinct frequency bands associated with each of the one or more PAs.

Example 20 includes the subject matter of example 16, wherein each of the one or more PAs is configured to transmit a distinct input signal, wherein the set of predefined criteria comprise, for each of the one or more PAs, a set of signal characteristics associated with the distinct input signal, wherein the set of signal characteristics comprise one or more of a spectrum of the distinct input signal, a bandwidth of the distinct input signal, a contiguity of the distinct input signal, a number of spectral clusters of the distinct input signal, one or more distances between spectral clusters of the distinct input signal, or a modulation scheme associated with the distinct input signal.

Example 21 includes the subject matter of example 20, wherein the present transmission mode comprises an intra-band CA mode.

Example 22 includes the subject matter of example 20, wherein the one or more PAs comprises a second PA of the set of second PAs when the bandwidth of the distinct input signal associated with the second PA exceeds a maximum supported bandwidth associated with the first DC-to-DC converter.

Example 23 includes the subject matter of example 16, wherein the first DC-to-DC converter is further configured to provide the first supply voltage according to the APT mode, wherein the control component is further configured to select, based at least in part on the set of predefined criteria, between the first DC-to-DC converter providing the first supply voltage according to the ET mode and the first DC-to-DC converter providing the first supply voltage according to the APT mode.

Example 24 includes the subject matter of example 1, wherein the present transmission mode comprises a single carrier mode, wherein the one or more PAs is a single PA, wherein the single PA is one of the first PAs when a projected output power of the single PA is above a threshold value, and wherein the single PA is one of the second PAs when a projected output power of the single PA is below a threshold value.

Example 25 includes the subject matter of example 1, wherein the present transmission mode comprises an interband CA mode, and wherein the one or more PAs comprise one of the first PAs and one of the second PAs, and wherein each of the one or more PAs is configured to simultaneously transmit in the distinct frequency band associated with that PA.

Example 26 includes the subject matter of example 1, wherein the present transmission mode comprises a dual subscriber identity module (SIM) dual active mode, and wherein the one or more PAs comprise one of the first PAs and one of the second PAs, and wherein each of the one or more PAs is configured to simultaneously transmit in the distinct frequency band associated with that PA.

Example 27 includes the subject matter of example 1, further comprising a third DC-to-DC converter configured to provide a third supply voltage according to a mode associated with the third DC-to-DC converter, wherein the mode associated with the third DC-to-DC converter is one of the APT mode or the ET mode, wherein each power amplification component of a third subset of the plurality of power amplification components comprises a third PA configured to transmit in the distinct frequency band and configured to operate according to the mode associated with the third DC-to-DC converter, wherein the third DC-to-DC converter is coupled to each of the third PAs, and wherein the control component selects at most one of the third PAs.

Example 28 is a system for facilitating envelope tracking (ET) in connection with single-band or multi-band transmission, which includes a plurality of power amplifiers (PAs) configured to transmit in distinct frequency bands, a first DC-to-DC converter, a second DC-to-DC converter, a control component, and one or more switching elements. The first DC-to-DC converter is configured to provide a first supply voltage according to an ET mode of operation. The second DC-to-DC converter is configured to provide a second supply voltage according to an average power tracking (APT) mode of operation. The control component is configured to determine a present transmission mode and to select, based at least in part on the present transmission mode, one of the plurality of PAs, and to select, based at least in part on the present transmission mode, one of the first DC-to-DC converter and the second DC-to-DC converter and an associated supply voltage. The one or more switching elements are configured to couple the selected DC-to-DC converter to the selected PA. The selected DC-to-DC converter is configured to provide the selected supply voltage to the selected PA.

Example 29 includes the subject matter of example 28, wherein the control component is further configured to determine a set of predefined criteria, and wherein the control component selects the selected DC-to-DC converter based at least in part on the predefined criteria.

Example 30 includes the subject matter of example 29, wherein the set of predefined criteria comprise a first projected net current consumption associated with the first DC-to-DC converter providing the first supply voltage to the selected PA and a second projected net current consumption associated with the second DC-to-DC converter providing the second supply voltage to the selected PA.

Example 31 includes the subject matter of example 30, wherein the first projected net current consumption is determined based at least in part on a first projected output power of the selected PA when provided the first supply voltage and on a second projected output power of the selected PA when provided the second supply voltage.

Example 32 includes the subject matter of any one of examples 29-31, wherein the selected PA is configured to transmit a first input signal, wherein the set of predefined criteria comprise a set of signal characteristics associated with the first input signal, wherein the set of signal characteristics comprise one or more of a spectrum of the first input signal, a bandwidth of the first input signal, a contiguity of the first input signal, a number of spectral clusters of the first input signal, one or more distances between spectral clusters of the distinct input signal, or a modulation scheme associated with the distinct input signal.

Example 33 includes the subject matter of any variation of example 32, including or omitting optional elements, wherein the present CA mode comprises an intra-band CA mode.

Example 34 includes the subject matter of example 29, wherein the selected PA is configured to transmit a first input signal, wherein the set of predefined criteria comprise a set of signal characteristics associated with the first input signal, wherein the set of signal characteristics comprise one or more of a spectrum of the first input signal, a bandwidth of the first input signal, a contiguity of the first input signal, a number of spectral clusters of the first input signal, one or more distances between spectral clusters of the distinct input signal, or a modulation scheme associated with the distinct input signal.

Example 35 includes the subject matter of example 34, wherein the present CA mode comprises an intra-band CA mode.

Example 36 includes the subject matter of example 28, wherein the present CA mode comprises an inter-band CA mode, and wherein the unselected DC-to-DC converter is configured to provide the unselected supply voltage to the unselected PA.

Example 37 is a method of facilitating envelope tracking (ET) in connection with single-band or multi-band transmission. The method includes determining a present transmission mode and determining a set of predefined criteria. The method also includes selecting, based at least in part on the present transmission mode and the set of predefined criteria, one or more power amplifiers (PAs) from among a set of first PAs and a set of second PAs, wherein each first PA is configured to transmit in a distinct frequency band and is associated with a second PA configured to transmit in the same distinct frequency band, wherein each of the first PAs is configured to operate in an ET mode of operation, wherein each of the second PAs is configured to operate in an average power tracking (APT) mode of operation. Additionally, the method includes providing a first supply voltage according to the ET mode to each of the one or more PAs from the set of first PAs and providing a second supply voltage according to the APT mode to each of the one or more PAs from the set of second PAs.

Example 38 includes the subject matter of example 37, wherein each of the one or more selected PAs is configured to transmit a distinct input signal, and wherein determining the set of predefined criteria comprises determining a set of signal characteristics associated with the distinct input signal, wherein the set of signal characteristics comprise one or more of a spectrum of the distinct input signal, a bandwidth of the distinct input signal, a contiguity of the distinct input signal, a number of spectral clusters of the distinct input signal, one or more distances between spectral clusters of the distinct input signal, or a modulation scheme associated with the distinct input signal.

Example 39 includes the subject matter of any one of examples 37-38, wherein determining the set of predefined criteria includes: determining, for each of the one or more PAs, a projected ET current consumption of the first PA configured to operate in the distinct frequency band of that PA; determining, for each of the one or more PAs, a projected APT current consumption of the second PA configured to operate in the distinct frequency band of that PA; and determining, for each of the one or more PAs, a projected net current consumption that comprises the sum of the projected ET current consumption of that PA and the projected APT current consumptions of each other PA of the one or more PAs.

Example 40 includes the subject matter of example 37, wherein determining the set of predefined criteria includes: determining, for each of the one or more PAs, a projected ET current consumption of the first PA configured to operate in the distinct frequency band of that PA; determining, for each of the one or more PAs, a projected APT current consumption of the second PA configured to operate in the distinct frequency band of that PA; and determining, for each of the one or more PAs, a projected net current consumption that comprises the sum of the projected ET current consumption of that PA and the projected APT current consumptions of each other PA of the one or more PAs.

Example 41 includes the subject matter of example 37, wherein at most one PA of the set of first PAs is selected and at most one PA of the set of second PAs is selected.

Example 42 is a system for envelope tracking (ET) in connection with single-band or multi-band transmission. The system includes a plurality of means for amplifying, wherein each means for amplifying of the plurality of means for amplifying is associated with a distinct frequency band, wherein each means for amplifying of a first subset of the plurality of means for amplifying comprises a first power amplifier (PA) configured to transmit in the distinct frequency band and configured to operate according to an ET mode of operation, wherein each power amplification component of a second subset of the plurality of means for amplifying comprises a second PA configured to transmit in the distinct frequency band and configured to operate according to an average power tracking (APT) mode of operation. The system also includes a first means for converting the voltage of DC signals configured to provide a first supply voltage according to the ET mode and coupled to each of the first PAs. Additionally, the system includes a second means for converting the voltage of DC signals configured to provide a second supply voltage according to the APT mode and coupled to each of the second PAs. The system further includes a means for controlling configured to determine a present transmission mode and to select, based at least in part on the present transmission mode, one or more PAs of the plurality of means for amplifying.

Example 43 includes the subject matter of example 42, wherein the one or more PAs comprise at most one of the first PAs and at most one of the second PAs.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A system for envelope tracking (ET) in connection with single-band or multi-band transmission, comprising:
   a plurality of power amplification components, wherein each power amplification component of the plurality of power amplification components is associated with a distinct frequency band, wherein each power amplification component of a first subset of the plurality of power amplification components comprises a first power amplifier (PA) configured to transmit in the distinct frequency band and configured to operate according to an ET mode of operation, wherein each power amplification component of a second subset of the plurality of power amplification components comprises a second PA configured to transmit in the distinct frequency band and configured to operate according to an average power tracking (APT) mode of operation;
   a first DC-to-DC converter configured to provide a first supply voltage according to the ET mode and coupled to each of the first PAs;
   a second DC-to-DC converter configured to provide a second supply voltage according to the APT mode and coupled to each of the second PAs; and
   a control component configured to determine a present transmission mode and to select, based at least in part on the present transmission mode, one or more PAs of the plurality of power amplification components.

2. The system of claim 1, wherein the one or more PAs comprise at most one of the first PAs and at most one of the second PAs.

3. The system of claim 1, wherein at least two of the plurality of power amplification components comprise both a first PA and a second PA.

4. The system of claim 1, wherein the control component is further configured to determine a set of predefined criteria, and wherein the control component selects the one or more PAs based at least in part on the set of predefined criteria.

5. The system of claim 4, wherein the set of predefined criteria comprise, for each of the one or more PAs, a first projected net current consumption associated with the first DC-to-DC converter providing the first supply voltage to the first PA of each power amplification component comprising at least one of the one or more PAs and a second projected net current consumption associated with the second DC-to-DC converter providing the second supply voltage to the second PA of each power amplification component comprising at least one of the one or more PAs.

6. The system of claim 5, wherein the first projected net current consumption is determined based at least in part on a first projected output power of the first PA of each power amplification component comprising at least one of the one or more PAs and on a second projected output power of the second PA of each power amplification component comprising at least one of the one or more PAs.

7. The system of claim 5, wherein the first and second projected net current consumptions are determined based at least in part on a comparison between the distinct frequency bands associated with each of the one or more PAs.

8. The system of claim 4, wherein each of the one or more PAs is configured to transmit a distinct input signal, wherein the set of predefined criteria comprise, for each of the one or more PAs, a set of signal characteristics associated with the distinct input signal, wherein the set of signal characteristics comprise one or more of a spectrum of the distinct input signal, a bandwidth of the distinct input signal, a contiguity of the distinct input signal, a number of spectral clusters of the distinct input signal, one or more distances between spectral clusters of the distinct input signal, or a modulation scheme associated with the distinct input signal.

9. The system of claim 8, wherein the present transmission mode comprises an intra-band CA mode.

10. The system of claim 8, wherein the one or more PAs comprises a second PA of the set of second PAs when the bandwidth of the distinct input signal associated with the second PA exceeds a maximum supported bandwidth associated with the first DC-to-DC converter.

11. The system of claim 4, wherein the first DC-to-DC converter is further configured to provide the first supply voltage according to the APT mode, wherein the control component is further configured to select, based at least in part on the set of predefined criteria, between the first DC-to-DC converter providing the first supply voltage according to the ET mode and the first DC-to-DC converter providing the first supply voltage according to the APT mode.

12. The system of claim 1, wherein the present transmission mode comprises a single carrier mode, wherein the one or more PAs is a single PA, wherein the single PA is one of the first PAs when a projected output power of the single PA is above a threshold value, and wherein the single PA is one of the second PAs when a projected output power of the single PA is below a threshold value.

13. The system of claim 1, wherein the present transmission mode comprises an inter-band CA mode, and wherein the one or more PAs comprise one of the first PAs and one of the second PAs, and wherein each of the one or more PAs is configured to simultaneously transmit in the distinct frequency band associated with that PA.

14. The system of claim 1, wherein the present transmission mode comprises a dual subscriber identity module (SIM) dual active mode, and wherein the one or more PAs comprise one of the first PAs and one of the second PAs, and wherein each of the one or more PAs is configured to simultaneously transmit in the distinct frequency band associated with that PA.

15. The system of claim 1, further comprising a third DC-to-DC converter configured to provide a third supply voltage according to a mode associated with the third DC-to-DC converter, wherein the mode associated with the third DC-to-DC converter is one of the APT mode or the ET mode, wherein each power amplification component of a third subset of the plurality of power amplification components comprises a third PA configured to transmit in the distinct frequency band and configured to operate according to the mode associated with the third DC-to-DC converter, wherein the third DC-to-DC converter is coupled to each of the third PAs, and wherein the control component selects at most one of the third PAs.

16. A system for envelope tracking (ET) in connection with single-band or multi-band transmission, comprising:
a plurality of power amplifiers (PAs) configured to transmit in distinct frequency bands;
a first DC-to-DC converter configured to provide a first supply voltage according to an ET mode of operation;
a second DC-to-DC converter configured to provide a second supply voltage according to an average power tracking (APT) mode of operation;
a control component configured to determine a present transmission mode and to select, based at least in part on the present transmission mode, one of the plurality of PAs, and to select, based at least in part on the present transmission mode, one of the first DC-to-DC converter and the second DC-to-DC converter and an associated supply voltage; and
one or more switching elements configured to couple the selected DC-to-DC converter to the selected PA,
wherein the selected DC-to-DC converter is configured to provide the selected supply voltage to the selected PA.

17. The system of claim 16, wherein the control component is further configured to determine a set of predefined criteria, and wherein the control component selects the selected DC-to-DC converter based at least in part on the predefined criteria.

18. The system of claim 17, wherein the set of predefined criteria comprise a first projected net current consumption associated with the first DC-to-DC converter providing the first supply voltage to the selected PA and a second projected net current consumption associated with the second DC-to-DC converter providing the second supply voltage to the selected PA.

19. The system of claim 18, wherein the first projected net current consumption is determined based at least in part on a first projected output power of the selected PA when provided the first supply voltage and on a second projected output power of the selected PA when provided the second supply voltage.

20. The system of claim 17, wherein the selected PA is configured to transmit a first input signal, wherein the set of predefined criteria comprise a set of signal characteristics associated with the first input signal, wherein the set of signal characteristics comprise one or more of a spectrum of the first input signal, a bandwidth of the first input signal, a contiguity of the first input signal, a number of spectral clusters of the first input signal, one or more distances between spectral clusters of the distinct input signal, or a modulation scheme associated with the distinct input signal.

21. The system of claim 20, wherein the present CA mode comprises an intra-band CA mode.

22. The system of claim 16, wherein the present CA mode comprises an inter-band CA mode, and wherein the unselected DC-to-DC converter is configured to provide the unselected supply voltage to the unselected PA.

23. A method of envelope tracking (ET) in connection with single-band or multi-band transmission, comprising:
   determining a present transmission mode;
   determining a set of predefined criteria;
   selecting, based at least in part on the present transmission mode and the set of predefined criteria, one or more power amplifiers (PAs) from among a set of first PAs and a set of second PAs, wherein each first PA is configured to transmit in a distinct frequency band and is associated with a second PA configured to transmit in the same distinct frequency band, wherein each of the first PAs is configured to operate in an ET mode of operation, wherein each of the second PAs is configured to operate in an average power tracking (APT) mode of operation;
   providing a first supply voltage according to the ET mode to each of the one or more PAs from the set of first PAs; and
   providing a second supply voltage according to the APT mode to each of the one or more PAs from the set of second PAs.

24. The method of claim 23, wherein each of the one or more PAs is configured to transmit a distinct input signal, and wherein determining the set of predefined criteria comprises determining a set of signal characteristics associated with the distinct input signal, wherein the set of signal characteristics comprise one or more of a spectrum of the distinct input signal, a bandwidth of the distinct input signal, a contiguity of the distinct input signal, a number of spectral clusters of the distinct input signal, one or more distances between spectral clusters of the distinct input signal, or a modulation scheme associated with the distinct input signal.

25. The method of claim 23, wherein determining the set of predefined criteria comprises:
   determining, for each of the one or more PAs, a projected ET current consumption of the first PA configured to operate in the distinct frequency band of that PA;
   determining, for each of the one or more PAs, a projected APT current consumption of the second PA configured to operate in the distinct frequency band of that PA; and
   determining, for each of the one or more PAs, a projected net current consumption that comprises the sum of the projected ET current consumption of that PA and the projected APT current consumptions of each other PA of the one or more PAs.

\* \* \* \* \*